(12) United States Patent
Fujito et al.

(10) Patent No.: US 7,072,218 B2
(45) Date of Patent: Jul. 4, 2006

(54) SEMICONDUCTOR INTEGRATED CIRCUIT, SEMICONDUCTOR NON-VOLATILE MEMORY, MEMORY CARD, AND MICROCOMPUTER

(75) Inventors: Masamichi Fujito, Kodaira (JP); Yuko Nakamura, Kiryu (JP); Kazufumi Suzukawa, Ichikawa (JP); Toshihiro Tanaka, Akiruno (JP); Yutaka Shinagawa, Iruma (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 151 days.

(21) Appl. No.: 10/486,638

(22) PCT Filed: Jul. 3, 2002

(86) PCT No.: PCT/JP02/06709

§ 371 (c)(1),
(2), (4) Date: Feb. 12, 2004

(87) PCT Pub. No.: WO03/021603

PCT Pub. Date: Mar. 13, 2003

(65) Prior Publication Data

US 2004/0212014 A1 Oct. 28, 2004

(30) Foreign Application Priority Data

Aug. 31, 2001 (JP) ............................... 2001-262924

(51) Int. Cl.
*G11C 16/04* (2006.01)
(52) U.S. Cl. .................. 365/185.18; 365/226
(58) Field of Classification Search ........... 365/185.18, 365/226, 189.11, 190, 230.06, 198.11
See application file for complete search history.

(56) References Cited

U.S. PATENT DOCUMENTS

| | | | | |
|---|---|---|---|---|
| 5,646,885 A | * | 7/1997 | Matsuo et al. | 365/185.05 |
| 5,812,459 A | * | 9/1998 | Atsumi et al. | 365/185.23 |
| 6,046,936 A | | 4/2000 | Tsujikawa et al. | 365/185.03 |
| 6,078,519 A | | 6/2000 | Kanamitsu et al. | 365/185.03 |

FOREIGN PATENT DOCUMENTS

| | | |
|---|---|---|
| JP | 07-282579 | 10/1995 |
| JP | 11-176180 | 7/1999 |
| JP | 11-232886 | 8/1999 |
| JP | 11-345494 | 12/1999 |
| JP | 2001-028189 | 1/2001 |
| JP | 2002-197881 | 7/2002 |

\* cited by examiner

*Primary Examiner*—Thong Q. Le
(74) *Attorney, Agent, or Firm*—Miles & Stockbridge PC

(57) ABSTRACT

A high voltage output driver derives operational power from high voltages and a switching circuit which reverses the output state of the high voltage output driver. The high voltage output driver has in a current path of the high voltages, a series circuit of a first MOS transistor (M1) and second MOS transistor (M2), with the serial connection node thereof being the driver output terminal. The switching circuit operates to reverse the complementary switching states of the first and second MOS transistors such that one transistor in the on-state is switched to an off-state first and the other transistor is switched to an on-state afterward. Even if the other MOS transistor has its Vds exceeding the minimum breakdown voltage when it operates to turn on, the through current path is already shut off, and therefore the high voltage output driver does not break down.

19 Claims, 31 Drawing Sheets

(1) WORD LINE : SELECTED → UNSELECTED (2) WORD LINE : UNSELECTED → SELECTED (WITHOUT VERIFICATION)

(WITH VERIFICATION)

(NOR CONFIGURATION)

(Di-NOR CONFIGURATION)

(NAND CONFIGURATION)

(AND CONFIGURATION)

2-VALUE FLASH MEMORY

4-VALUE FLASH MEMORY

SEMICONDUCTOR INTEGRATED CIRCUIT, SEMICONDUCTOR NON-VOLATILE MEMORY, MEMORY CARD, AND MICROCOMPUTER

TECHNICAL FIELD

The present invention relates to a semiconductor integrated circuit which uses high voltages, and to the prevention of breakdown of MOS transistors having high voltage application. The present invention further relates to a technique which is applicable to electrically erasable and writable semiconductor non-volatile memories and ferrodielectric memories, DRAMs (dynamic random access memories) and SDRAMs (synchronous DRAMs) in which step-up voltage is used for word line selection voltage, microcomputers having on-chip provision of electrically erasable and writable non-volatile memories, and dot-matrix liquid crystal display panels.

BACKGROUND ART

An electrically erasable and writable flash memory cell has on its channel region a floating gate and a control gate which are separated by an insulation film, and it operates to shift up the threshold voltage of the memory cell by injecting hot electrons to the floating gate, and to shift down the threshold voltage by discharging injected electrons in the form of a tunnel current through the gate insulation film. For the write operation based on the injection of hot electrons and the erase operation based on the tunnel discharge of electrons, it is necessary to apply high voltages to the word lines, bit lines, source lines, and substrate. Switching of memory cells to be written or erased requires switching of word lines and source lines having high voltage application.

Publications which describe such flash memories include, for example, Japanese Patent Unexamined Publications No.Hei 11(1999)-232886 and No. Hei 11(1999)-345494.

High voltage driving of word lines and source lines is implemented by use of driver circuits which derive operational power from high-voltage power. The word lines and source lines are each provided with a driver circuit, which is formed of a CMOS inverter, etc. In case the high voltage used for writing or erasing is higher than the minimum breakdown voltage (BVds_min) between the source and drain of MOS transistors which form the driver circuit, if the driver circuit has its switching state reversed in the presence of high voltage application, the MOS transistors will break down, causing the driver circuit to become inoperative. On this account, it has been necessary conventionally to lower the operational power voltages of the driver circuits and associated switching signal level shift circuits below the minimum breakdown voltage (BVds_min) at the switching of word lines or source lines which undergo high voltage driving. For example, at every writing of a word line, the high voltage supply node and word line are discharged, word lines are switched, and the voltage of the high voltage supply node and word line is stepped up again. Voltage step-up circuits which produce high voltages used for writing are formed of charge pump circuits, etc., and the frequent repetition of voltage step-up and discharge of the high voltage supply nodes, which is accompanied by the charging and discharging of voltage smoothing capacitors having a large capacitance, cause a significant waste of power and time expenditure for charging and discharging, resulting in a slow write operation.

It is an object of the present invention to provide a semiconductor integrated circuit, such as a semiconductor non-volatile memory or microcomputer, which is immune to breakdown at the event of switching of the high voltage output state of the high voltage output driver in the presence of a high voltage power supply.

Another object of the present invention is to provide a semiconductor integrated circuit, such as a semiconductor non-volatile memory or a microcomputer having on-chip provision of this memory, which is capable of shortening the rewriting time.

Still another object of the present invention is to alleviate, by means of a relatively simple circuit arrangement, the occurrence of breakdown of MOS transistors which form a circuit for converting input signal levels into high voltage signal levels.

The foregoing and other objects and novel features of the present invention will become apparent from the following description and attached drawings.

DISCLOSURE OF THE INVENTION

Among the aspects of the present invention disclosed in this specification, representative aspects are briefed as follows.

(1) A semiconductor integrated circuit based on this invention comprises a memory cell array which is a matrix arrangement of a plurality of circuital cells which are adapted to operate selectively in certain manners by having application of high voltages, a plurality of signal lines for feeding the high voltages to the circuital cells, high voltage output drivers (1, 1s, 1b, 1p) which are provided for the signal lines individually, output switching circuits (2, 2v) for the high voltage output drivers, and a high voltage generation circuit (15) which supplies high-voltage operational power to the high voltage output drivers. The high voltage output driver has in a current path of the high voltages a series circuit of a first MOS transistor (M1) and second MOS transistor (M2), with the serial connection node thereof being the driver output terminal. The output switching circuit operates in response to a switching command signal to reverse the complementary switching states of the first and second MOS transistors such that one transistor in the on-state is switched to the off-state first and another transistor is switched to the on-state afterward.

For example, in the above-mentioned output driver, when the first MOS transistor of the high voltage side is in the on-state, the source-drain voltage (Vds) of the second MOS transistor has high voltage application corresponding to the above-mentioned high voltages. A case is assumed in which the MOS transistor has a minimum breakdown voltage (BVds_min) lower than its source-drain voltage. In this state, if it is attempted to reverse the switching states of the first and second MOS transistors simultaneously, the second MOS transistor has its Vds falling with the increase of the drain-source current (Ids). The first MOS transistor has its Ids increasing with the increase of Vds. When the Vds of the first MOS transistor exceeds the minimum breakdown voltage (BVds_min), the breakdown occurs between the drain and source, causing a large current Ids to flow through both the first and second MOS transistors. In contrast, the above-mentioned inventive scheme turns off the on-state transistor (transistor of Vds=0 V) first and turns on the MOS transistor having high voltage application for Vds afterward, and consequently even if the Vds of the MOS transistor having high voltage application for Vds exceeds the minimum breakdown voltage (BVds_min) when it operates to turn on, the through current path is already cut off and therefore the high voltage output driver does not break down.

In consequence, it is possible to reverse the output of high voltage output driver in the presence of application of the power voltage above the minimum breakdown voltage (BVds_min).

As a specific design, the above-mentioned circuital cell is an electrically erasable and writable non-volatile memory cell for example. With attention being paid to a word line as a case of the above-mentioned signal line, the output switching circuit for the high voltage output driver (1) which is connected to the word line is supplied with a word line select signal as the above-mentioned switching command signal. With attenuation being paid to a bit line as a case of the signal line, the output switching circuit for the high voltage output driver (1b) which is connected to the bit line is supplied with data to be written as the switching command signal. With attention being paid to a source line as a case of the signal line, the output switching circuit for the high voltage output driver (1s) which is connected to the source line is supplied with a source select signal as the switching command signal. With attention being paid, as a case of the signal line, to a substrate voltage feed line for feeding a substrate voltage to the semiconductor region where the channel of a non-volatile memory cell is formed, the output switching circuit for the high voltage output driver (1p) which is connected to the substrate voltage feed line is supplied with a substrate voltage select signal as the switching command signal. At the switching of word lines of high voltage driving and the switching of source lines of high voltage driving for the writing or erasing of non-volatile memory cells, it is not necessary to lower the operational power voltages of the high voltage output drivers down to the minimum breakdown voltage (BVds_min), and therefore it is not necessary to repeat the voltage step-up and discharging of the high voltage output nodes of the voltage step-up circuits which produce the high voltages for writing, whereby the waste of power can be prevented and the speed-up of write operation can be accomplished.

With the case of verification following the write or erase operation being considered, there is provided a third MOS transistor (M3) which is adapted to feed a word line voltage for verification to the word line which is connected to the node of the first and second MOS transistors. In this case, the output switching circuit for the high voltage output driver which is connected to the word line operates in response to the instruction of verification operation to switch off the first and second MOS transistors of the high voltage output driver connected to the word line and feed another word line voltage for verification from the third MOS transistor to the word line. In consequence, also in the case of supplying the verification voltage to the word line, it is not necessary to halt the supply of high-voltage operational power to the high voltage output driver and halt the high voltage generating operation of the charge pumps. The third MOS transistor is not required when a writing/erasing scheme without accompaniment of verification operation is adopted.

The inventive semiconductor integrated circuit can be applied to LSI memories having the above-mentioned non-volatile memory cells and microcomputers having an on-chip CPU which takes in information stored and read out of the non-volatile memory cells and outputs information to be written to the non-volatile memory cells. The semiconductor integrated circuit can also be applied to DRAMs and SDRAMs, in which, in case the above-mentioned circuital cells are dynamic memory cells and the signal lines are word lines, each output switching circuit for a high voltage output driver which is connected to a word line is supplied with a word line select signal which triggers the reversal of complementary switching states of the first and second MOS transistors. At this time, the high voltage has a role of bootstrap voltage for word line selection.

(2) The first and second MOS transistors can be of p-channel type and n-channel type, respectively. As a specific design, the output switching circuit is configured by including a sequencer section (5) which takes in the switching command signal and puts out a first timing signal (S1) and second timing signal (S2), a first voltage converting section (6) which takes in the first timing signal and puts out a first switching signal (SS1) of the first MOS transistor, and a second voltage converting section (7) which takes in the second timing signal and puts out a second switching signal (SS2) of the second MOS transistor. The first switching signal is a signal which changes in a range of a first voltage difference (vdd) downwardly from the source voltage (vccx) of the first MOS transistor, with the first voltage difference being preferably smaller than the minimum drain-source breakdown voltage of the p-channel MOS transistor of the output switching circuit. The second switching signal is a signal which changes in a range of a second voltage difference (vdd) upwardly from the source voltage (vssx) of the second MOS transistor, with the second voltage difference being preferably smaller than the minimum drain-source breakdown voltage of the n-channel MOS transistor of the output switching circuit. In consequence, the MOS transistors which form the first and second voltage converting sections do not break down between the drain and source.

As a specific design, the first and second timing signals are adapted to change between a ground voltage (vss) and a first power voltage (vdd) of the sequencer section, and the first and second voltage differences are equal to the voltage difference of the first power voltage from the ground voltage of the sequencer section.

As a further specific design, the first voltage converting section is configured by including a static latch circuit (SLT1) which includes multiple antiparallel-connected inverter circuits which derive operational power from the source voltage of the first MOS transistor and the voltage which is lower than the source voltage by the amount of the first power voltage, a first coupling capacitor (CC1) having one capacitive electrode coupled with one input/output node of the static latch circuit, and a second coupling capacitor (CC2) having one capacitive electrode coupled with another input/output node of the static latch circuit, with the first and second coupling capacitors having other capacitive electrodes supplied with complementary signals produced from the first timing signal and outputting latch information of the static latch circuit as the first switching signal. Similarly, the second voltage converting section is configured by including a static latch circuit (SLT2) which includes multiple antiparallel-connected inverter circuits which derive operational power from the source voltage of the second MOS transistor and the voltage which is higher than the source voltage by the amount of the first power voltage, a third coupling capacitor (CC3) having one capacitive electrode coupled with one input/output node of the static latch circuit, and a fourth coupling capacitor (CC4) having one capacitive electrode coupled with another input/output node of the static latch circuit, with the third and fourth coupling capacitors having other capacitive electrodes supplied with complementary signals produced from the second timing signal and outputting latch information of the static latch circuit as the second switching signal. In consequence, it is possible to accomplish a relatively simple circuit arrangement by which the MOS transistors which form the static latch circuit having high voltage application do not break down between the drain and source.

(3) A semiconductor non-volatile memory revealed from another viewpoint of this invention comprises by being included within a semiconductor chip a memory cell array which is a matrix arrangement of a plurality of non-volatile memory cells which are adapted to operate selectively for erasing and writing by having application of high voltages, a plurality of signal lines for feeding the high voltages to the non-volatile memory cells, high voltage output drivers which are provided for the source lines individually, output switching circuits for the high voltage output drivers, and a high voltage generation circuit which supplies high-voltage operational power to the high voltage output drivers. The high voltage output driver has in a current path of the high voltages a series circuit of a first MOS transistor and second MOS transistor, with the serial connection node thereof being the driver output terminal. The output switching circuit operates in response to a switching command signal to reverse the complementary switching states of the first and second MOS transistors such that one transistor in the on-state is switched to the off-state first and another transistor is switched to the on-state afterward.

A memory card (74) may be accomplished by forming on a card substrate the above-mentioned semiconductor non-volatile memory (39), an external interface circuit (75) which transacts commands and data with the outside, and a memory controller (76) which implements access control of the semiconductor non-volatile memory in response to commands given through the external interface circuit.

A microcomputer (60) revealed from another viewpoint of this invention comprises by being included within a semiconductor chip a non-volatile memory (61) including a memory cell array which is a matrix arrangement of a plurality of non-volatile memory cells which are adapted to operate for erasing and writing by having application of high voltages, a plurality of signal lines for feeding the high voltages to the non-volatile memory cells, high voltage output drivers which are provided for the signal lines individually, output switching circuits for the high voltage output drivers, and a high voltage generation circuit which supplies high-voltage operational power to the high voltage output drivers, a CPU (63) which is adapted to make access to the non-volatile memory, and a bus (62) which connects between the non-volatile memory and the CPU. The high voltage output driver has on a current path of the high voltages a series circuit of a first MOS transistor and second MOS transistor, with the serial connection node thereof being the driver output terminal. The output switching circuit operates in response to a switching command signal to reverse the complementary switching states of the first and second MOS transistors such that one transistor in the on-state is switched to the off-state first and another transistor is switched to the on-state afterward.

A semiconductor integrated circuit revealed from still another viewpoint of this invention comprises a high voltage generation circuit, a high voltage driver circuit which derives operational power from high voltages supplied from the high voltage generation circuit, and a switching circuit which reverses the output state of the high voltage output driver. The high voltage output driver has on a current path of the high voltages a series circuit of a first MOS transistor and second MOS transistor, with the serial connection node thereof being the driver output terminal. The switching circuit operates to reverse the complementary switching states of the first and second MOS transistors such that one transistor in the on-state is switched to the off-state first and another transistor is switched to the on-state afterward.

(4) Attention is paid to a voltage conversion circuit which employs a scheme of capacitive coupling. Firstly, it is a voltage converting circuit (6) of a positive voltage side. The circuit derives its operational power from a circuit ground voltage, first power voltage and second power voltage which is higher than the first power voltage. This voltage converting circuit consists of a static latch circuit which includes multiple antiparallel-connected inverter circuits which derive operational power from the second power voltage and the voltage which is lower than the second power voltage by the amount of the first power voltage, a first coupling capacitor having one capacitive electrode coupled with one input/output node of the static latch circuit, a second coupling capacitor having one capacitive electrode coupled with another input/output node of the static latch circuit, and an inverter which derives operational power from the ground voltage and first power voltage and is connected between another capacitive electrode of the first coupling capacitor and another capacitive electrode of the second coupling capacitor. This voltage converting circuit is adapted to release from the input/output node of the static latch circuit a signal which changes between the second power voltage and the voltage which is lower than the second power voltage by the amount of the first power voltage in response to a signal which changes between the ground voltage and the first power voltage and is input to the inverter.

Secondly, it is a voltage converting circuit (7) of a negate voltage side. The circuit derives its operational power from a circuit ground voltage, first power voltage and third power voltage which is lower than the circuit ground voltage. This voltage converting circuit consists of a static latch circuit which includes multiple untiparallel-connected inverter circuits which derive operational power from the third power voltage and the voltage which is higher than the third power voltage by the amount of the first power voltage, a first coupling capacitor having one capacitive electrode coupled with one input/output node of the static latch circuit, a second coupling capacitor having one capacitive electrode coupled with another input/output node of the static latch circuit, and an inverter which derives operational power from the ground voltage and first power voltage and is connected between another capacitive electrode of the first coupling capacitor and another capacitive electrode of the second coupling capacitor. This voltage converting circuit is adapted to release from the input/output node of the static latch circuit a signal which changes between the third power voltage and the voltage which is higher than the third power voltage by the amount of the first power voltage in response to a signal which changes between the ground voltage and the first power voltage and is put in to the inverter.

BEST MODE FOR CARRYING OUT THE INVENTION

<Word Line Switching>

Figure 1:
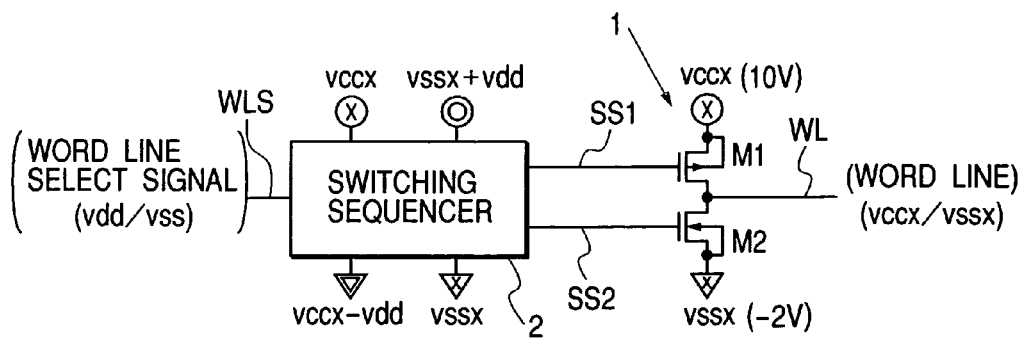
FIG. 1 is an explanatory diagram illustrating a word line driver which embodies the high voltage output driver and a switching sequencer which embodies the output switching circuit of the semiconductor integrated circuit based on this invention.

FIG. 1 illustrates a word line driver 1 which embodies the high voltage output driver and a switching sequencer 2 which embodies the output switching circuit of the semiconductor integrated circuit based on this invention. The word line driver 1 derives its operational power from a high positive voltage vccx (e.g., 10 V) and high negative voltage vssx (e.g., −2 V) generated by a high voltage generation circuit, and it is a series circuit of a first MOS transistor M1 of p-channel type and a second MOS transistor M2 of n-channel type, with the node of serial connection being connected as driver output terminal to a word line WL. The first MOS transistor M1 has its gate electrode supplied with a first switching signal SS1, and the second MOS transistor M2 has its gate electrode supplied with a second switching signal SS2.

The switching sequencer 2 derives its operational power from the high voltages vccx and vssx and intermediate voltages vssx+vdd and vccx+vdd. The switching sequencer 2 takes in a word line select signal WLS which embodies the switching command signal and changes between the voltage vdd (e.g., 3 V) and the circuit ground voltage vss (0 V), and it determines the levels of the first switching signal SS1 and second switching signal SS2 in accordance with the input signal levels.

In this example, the word line WL is connected to the control gate of an electrically erasable and writable non-volatile memory cell, e.g., flash memory cell. The non-volatile memory cell has a source region, channel region and drain region in a semiconductor region, and has the laminated formation of a floating gate and control gate covered by an insulation film on the channel region, although this construction is not compulsory. The write operation, for example, is implemented by conducting a current from the drain to the source thereby to create hot electrons in the drain region and injecting the electrons into the floating gate. In the write operation, the bit line connected to a memory cell to be written has application of the drain voltage for producing a drain current, and the word line connected to the control gate has application of the high positive voltage. The erase operation is implemented based on tunnel discharging of electrons, which have been injected in the floating gate, to the channel region or source region through the gate oxide film. In the erase operation, the high positive voltage is applied to the source line connected to the source region of the memory cell to be erased and a relatively low voltage is applied to the word line connected to the control gate.

Figure 2:
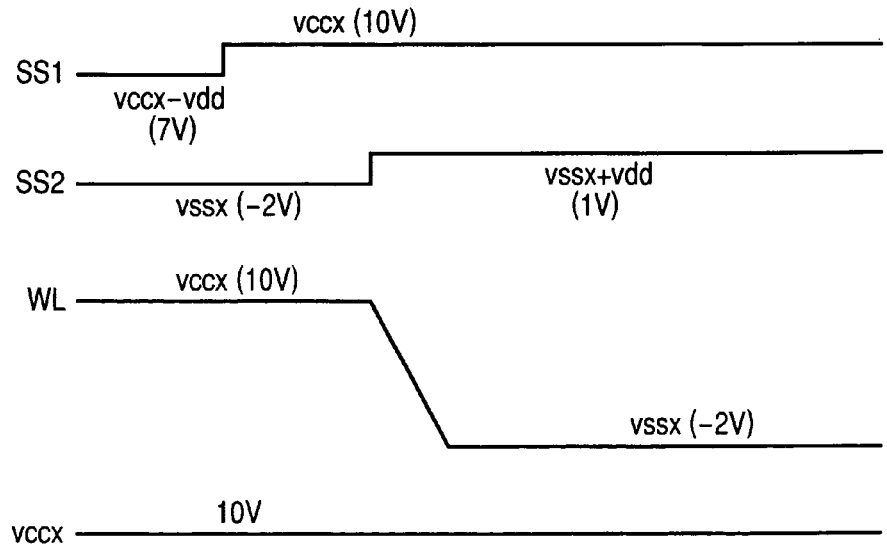
FIG. 2 is a timing chart illustrating the signal waveforms at the transition of a word line from the unselected state to the selected state implemented by the word line driver.
Figure 3:
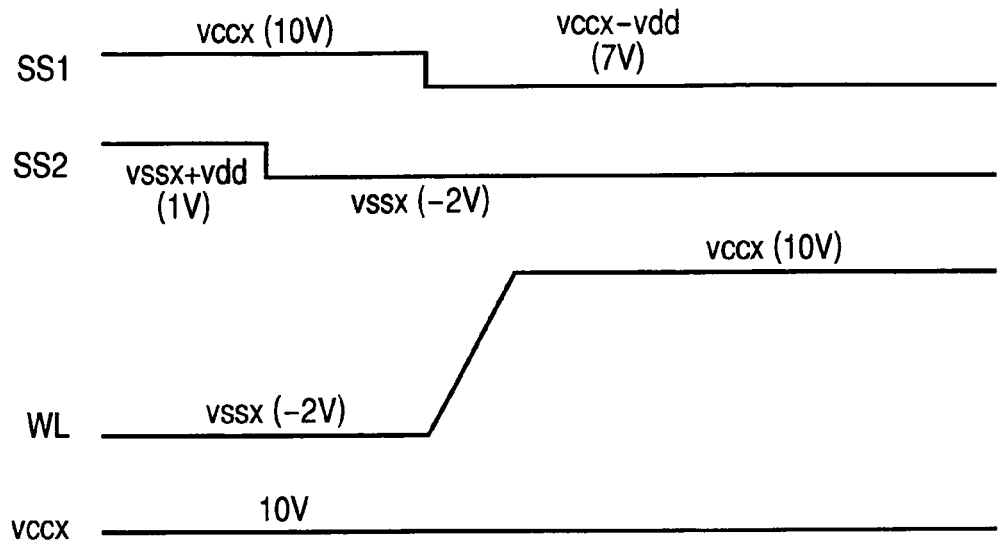
FIG. 3 is a timing chart illustrating the signal waveforms at the transition of a word line from the selected state to the unselected state implemented by the word line driver.

FIG. 2 illustrates the signal waveforms at the transition of a word line from the unselected state to the selected state implemented by the word line driver, and FIG. 3 illustrates the signal waveforms at the transition of a word line from the selected state to the unselected state implemented by the word line driver. It is obvious from these figures that the switching sequencer 2 reverses the complementary switching states of the first MOS transistor M1 and second MOS transistor M2 such that one transistor in the on-state is switched to the off-state first and another transistor is switched to the on-state afterward. In other words, the sequencer turns off one MOS transistor in the on-state of Vds=0 V first, and turns on another MOS transistor afterward.

Figure 4:
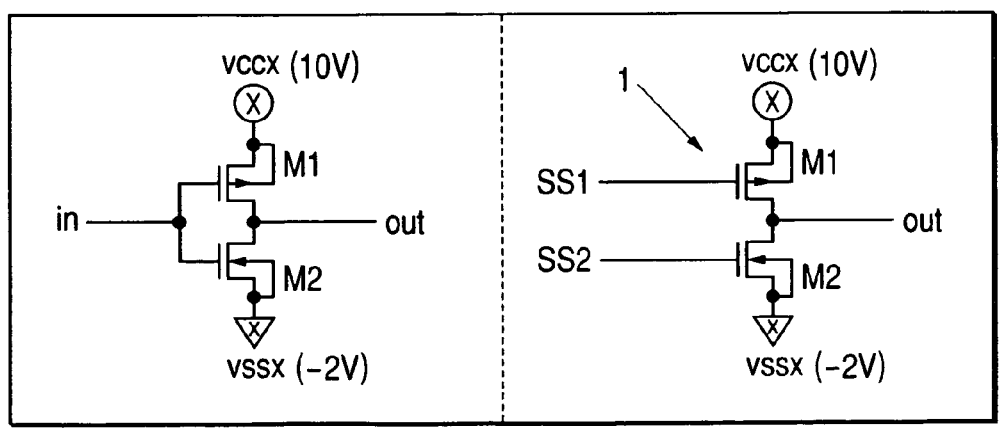
FIG. 4 is a circuit diagram showing a word line driver which is a comparative example against the word line driver of FIG. 1.
Figure 5:
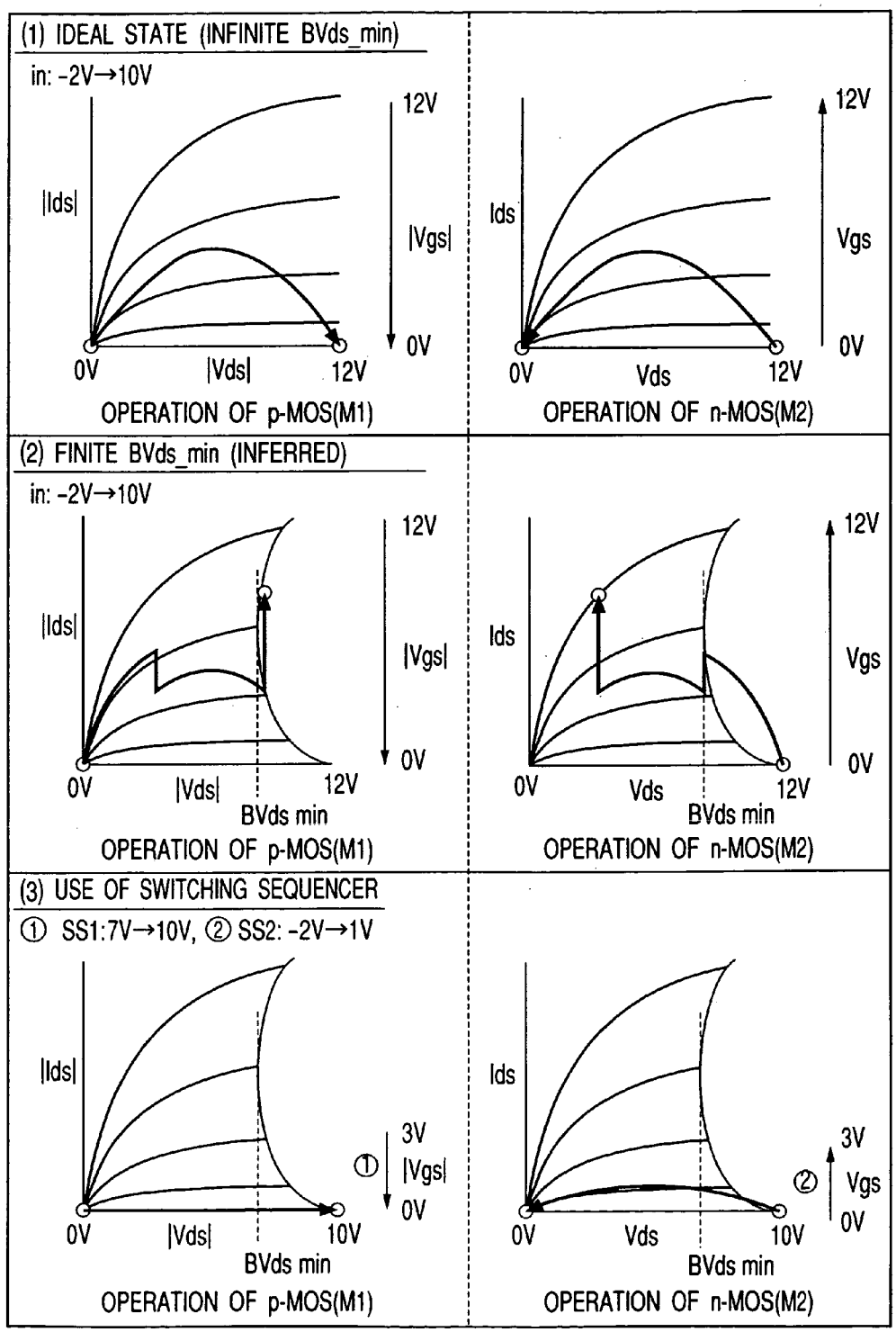
FIG. 5 is a set of explanatory diagrams of the Ids–Vds characteristics, showing by (1) the ideal states in which the minimum breakdown voltage (BVds_min) is infinite, showing by (2) the states of reality in which the minimum breakdown voltage (BVds_min) is finite, and showing by (3) the states of treatment by use of the switching sequencer.

The control behavior of the switching sequencer 2 will be explained with reference to FIG. 4 and FIG. 5. The circuit shown on the left-hand side of FIG. 4 is a conventional word line driver of CMOS inverter type having a commonly connected input "in". In case the minimum breakdown voltage (BVds_min) is infinite, or above 12 V, any of the MOS transistors M1 and M2 of even the conventional word line driver of FIG. 4 does not break down as shown by the Ids–Vds characteristics of the ideal state (1) in FIG. 5. However, in case the minimum breakdown voltage (BVds_min) is finite, or below 12 V, the Vds of the second MOS transistor (M2) of the conventional word line driver of FIG. 4 falls with the increase of the drain-source current (Ids) as shown by (2) in FIG. 5. In this case, the first MOS transistor (M1) has its Ids increasing with the rise of Vds. If the Vds of the first MOS transistor (M1) exceeds the minimum breakdown voltage (BVds_min), the transistor breaks down between the drain and source. At this time, the first MOS transistor (M1) and second MOS transistor (M2) are having transitional responses at the same timing, and the breakdown of the first MOS transistor (M1) causes a large current Ids to flow through both the first MOS transistor (M1) and second MOS transistor (M2). Whereas, as shown by (3) in FIG. 5 of the case of using the switching sequencer 2, by which the on-state transistor (transistor of Vds=0 V) is turned off first and the MOS transistor having high voltage application for Vds is turned on afterward, even if the Vds of the MOS transistor having high voltage application for Vds exceeds the minimum breakdown voltage (BVds_min) when it operates to turn on, the through current path is already cut off and therefore the word line driver 1 does not break down.

In consequence, the word line driver 1 can have its out reversed in the presence of application of the power voltage vccx plus vssx above the minimum breakdown voltage (BVds_min).

Figure 6:
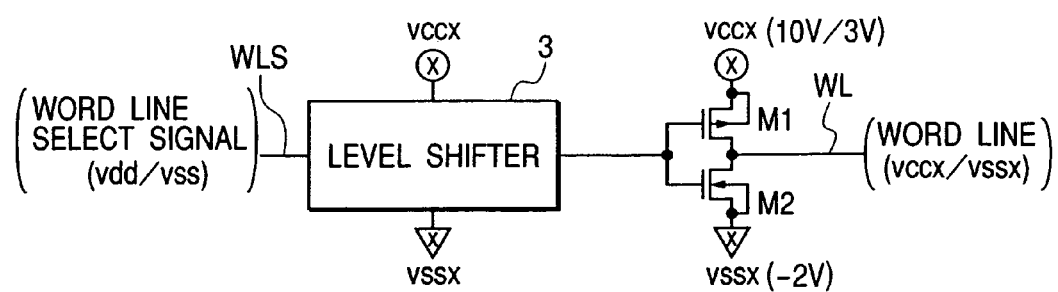
FIG. 6 is a circuit diagram showing a comparative circuit example in which a conventional word line driver is used in conjunction with a level shifter.
Figure 7:
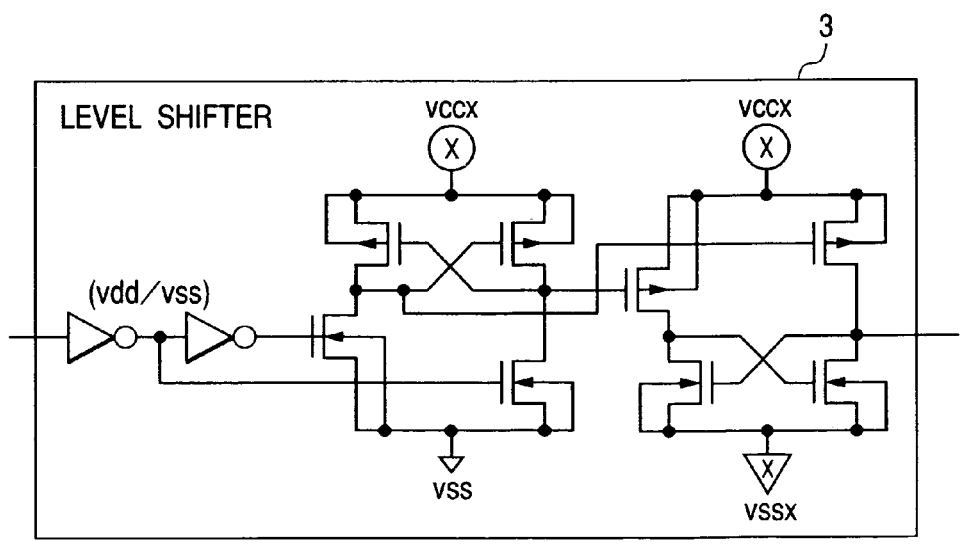
FIG. 7 is a circuit diagram showing an example of the level shifter.
Figure 8:
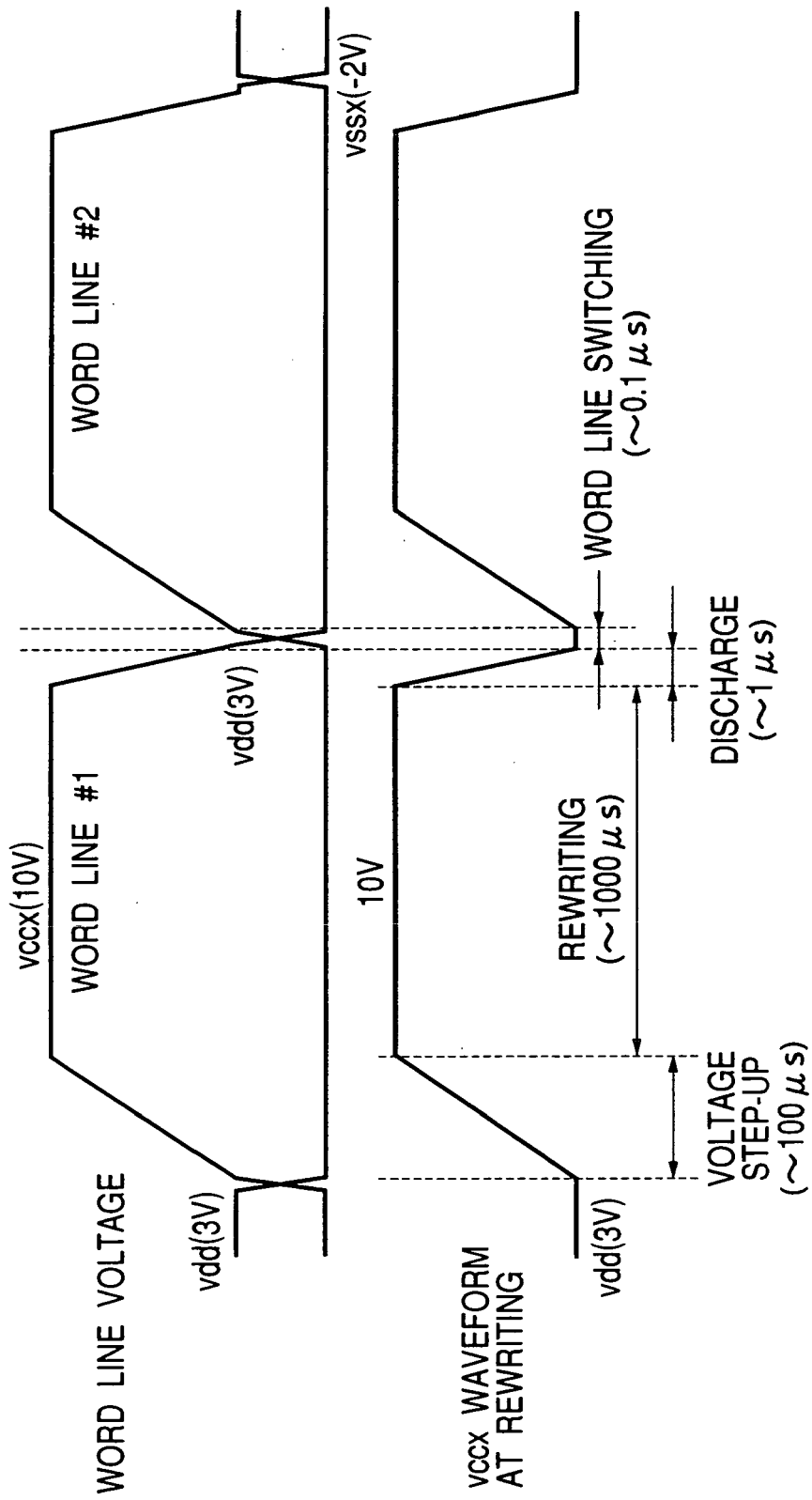
FIG. 8 is a timing chart showing the operational timing of word line switching which takes place after the supply voltage is stepped down by discharging of high-voltage power produced by a charge pump or the like in order to avoid the occurrence of breakdown at the switching of word lines of writing.
Figure 9:
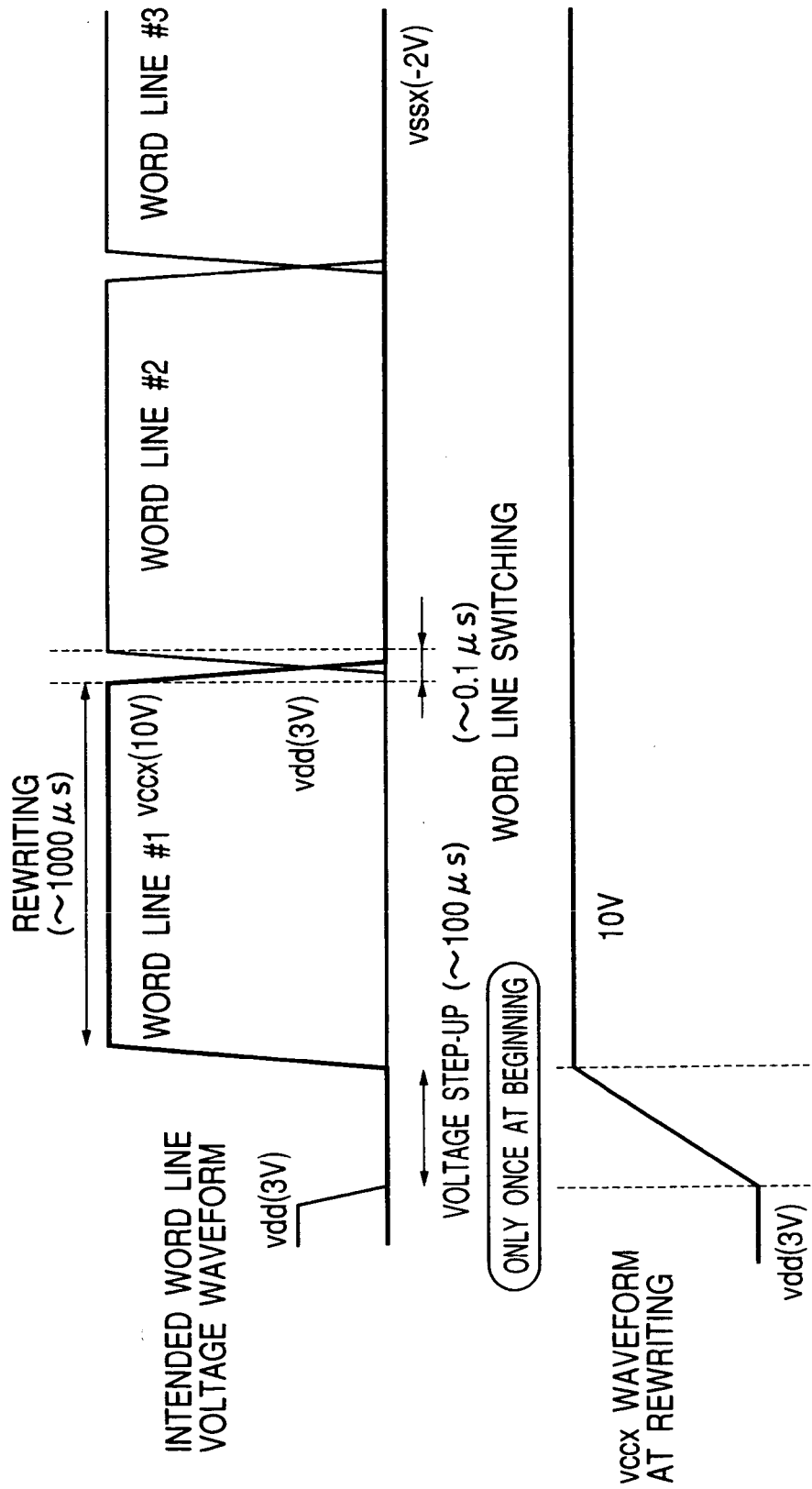
FIG. 9 is an explanatory diagram showing the word line voltage waveform, etc. at the word line switching in the presence of high-voltage power supply in the case of this invention shown in FIG. 1.

As illustrated in FIG. 6 for the case of using the conventional word line driver of FIG. 4, the word line select signal WLS is rendered level shifts in the positive and negative directions with a level shifter 3 and then input to the word line driver. The level shifter 3 has a circuit arrangement as shown for example in FIG. 7, in which the former stage implements the voltage step-up in the positive direction and the latter stage implements the voltage step-up in the negative direction. The conventional circuit arrangement of FIG. 6 can possibly break down when it reverses the output state while retaining the high-voltage power vccx and vssx intact as mentioned previously. Therefore, as illustrated in FIG. 8, when word lines of writing are switched, the high-voltage power vccx and vssx produced by charge pump circuits or the like (not shown) are discharged, the word lines are switched after the power voltage vccx and vssx have fallen, and the voltage step-up operation takes place following the switching. On this account, the discharge operation, word line switching operation and voltage step-up operation must be implemented at each switching of word lines of writing, resulting in a long write operation cycle time. In contrast, the inventive case explained on FIG. 1 can switch word lines in the presence of application of the high-voltage power vccx plus vssx, which solely requires the switching operation for the switching of word lines of writing, shortening the write operation cycle time by around 10% as illustrated in FIG. 9, whereby the speed-up of write operation can be accomplished.

<Switching Sequencer>

Figure 10:
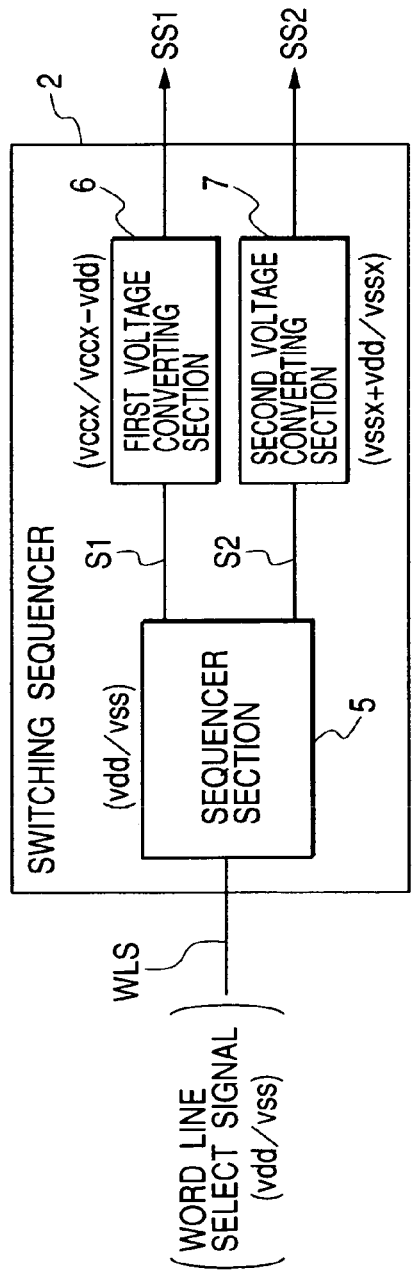
FIG. 10 is a block diagram showing an example of the switching sequencer.

FIG. 10 shows a specific example of the switching sequencer. The switching sequencer 2 is configured by including a sequencer section 5 which takes in the word line select signal WLS and outputs out a first timing signal S1 and second timing signal S2, a first voltage converting section 6 which takes in the first timing signal S1 and outputs a first switching signal SS1 for the first MOS transistor M1, and a second voltage converting section 7 which receives the second timing signal S2 and outputs a second switching signal SS2 for the second MOS transistor M2.

The first switching signal SS1 is a signal which changes in a range of a first voltage difference, e.g., voltage vdd, downwardly from the source voltage vccx of the first MOS transistor M1, with the voltage vdd being lower than the minimum drain-source breakdown voltage of the p-channel MOS transistor of the switching sequencer 2. Namely, the first switching signal SS1 changes in voltage level between vccx–vdd and vccx. The second switching signal SS2 is a signal which changes in a range of a second voltage difference, e.g., voltage vdd, upwardly from the source voltage vssx of the second MOS transistor M2, with the voltage vdd being lower than the minimum drain-source breakdown voltage of the n-channel MOS transistor of the switching sequencer 2. Namely, the second switching signal SS2 changes in voltage level between vssx and vssx+vdd. In consequence, the MOS transistors of the first voltage converting section 6 and second voltage converting section 7 do not break down between the drain and source. Moreover, owing to a small voltage difference of the gate voltages applied to the MOS transistors M1 and M2 of the word line driver 1, the MOS transistors M1 and M2 have a longer line-span.

Figure 11:
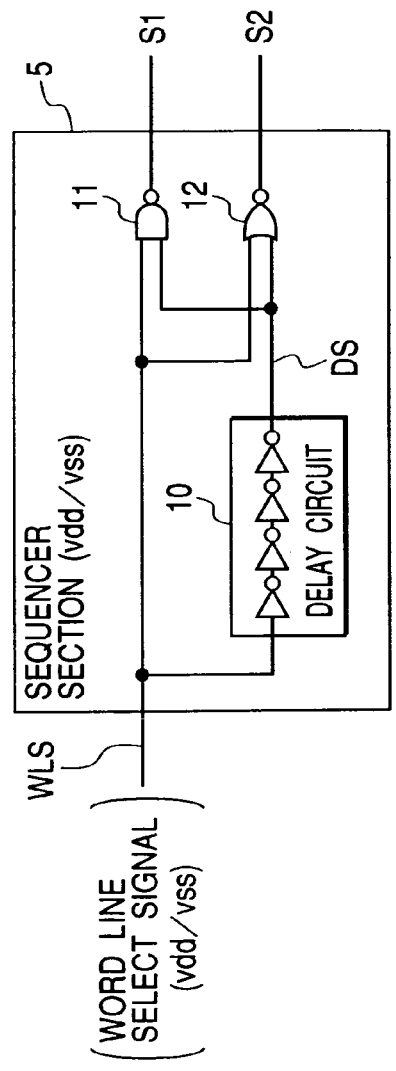
FIG. 11 is a block diagram showing an example of the sequencer section.

FIG. 11 shows an example of the sequencer section 5. The sequencer section 5 outputs the first timing signal S1 and second timing signal S2 which are derived from a negated logical product signal produced with a NAND gate 11 and a negated logical sum signal produced with a NOR gate 12, respectively, from the word line select signal WLS and a delayed version DS of the signal WLS.

Figure 12:
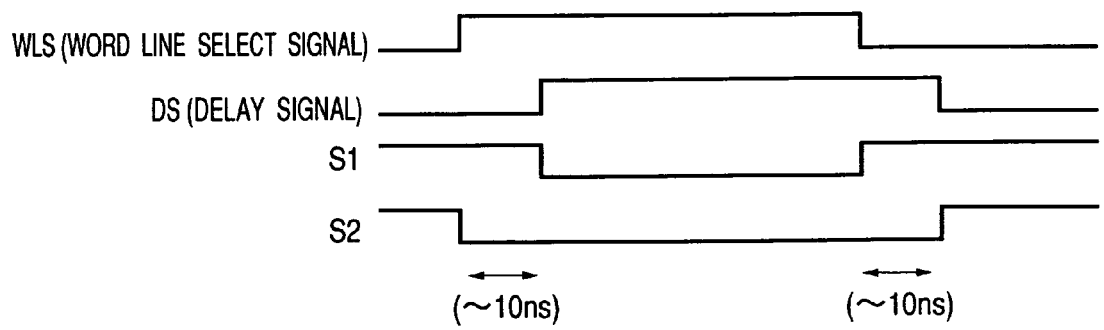
FIG. 12 is a waveform diagram of the timing signals S1 and S2 produced by the sequencer section of FIG. 11.

FIG. 12 illustrates the signal waveforms of the timing signals S1 and S2 produced by the sequencer section 5 of FIG. 11. When the timing signals S1 and S2 change from the high level to the low level, the transition of the signal S2 proceeds to time the turn-off of the on-state second transistor M2 first, and when the timing signals S1 and S2 change from the low level to the high level, the transition of the signal S1 proceeds to time the turn-off the on-state first transistor M1 first.

Figure 13:
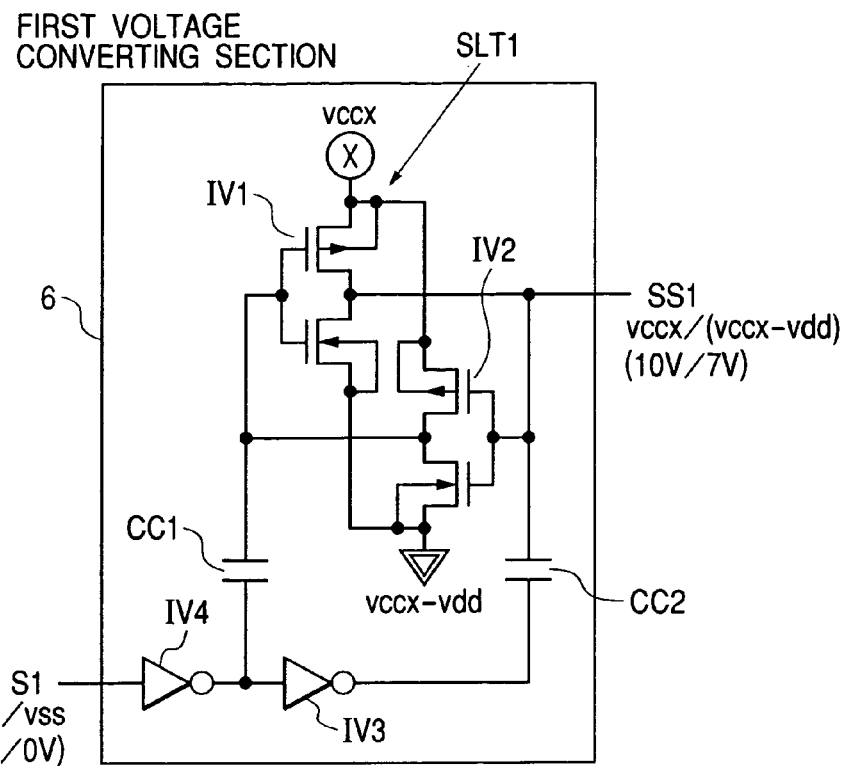
FIG. 13 is a circuit diagram showing an example of the first voltage converting section.

FIG. 13 shows an example of the first voltage converting section 6. The first voltage converting section 6 includes a static latch circuit SLT1 which includes multiple untiparallel-connected inverter circuits IV1 and IV2 which derive operational power from the source voltage vccx of the first MOS transistor and the voltage vccx–vdd which is lower than vccx by the amount of vdd. There are included a first coupling capacitor CC1 having one capacitive electrode coupled with one input/output node of the static latch circuit SLT1, and a second coupling capacitor CC2 having one capacitive electrode coupled with another input/output node of the static latch circuit. Connected between another capacitive electrode of the first coupling capacitor CC1 and another capacitive electrode of the second coupling capacitor CC2 is an inverter IV3 which derives operational power from the ground voltage vss and power voltage vdd, and connected, at the output, to the input of the inverter IV3 is another inverter IV4 which receives in the timing signal S1 and derives operational power from the ground voltage vss and power voltage vdd.

According to this first voltage converting section 6, when the first timing signal S1 which is input to the inverter IV4 changes between the ground voltage vss and the power voltage vdd, a varying component is delivered to a pair of input/output nodes of the static latch circuit via the coupling capacitors CC1 and CC2. Accordingly, the timing signal S1 having the level vdd or vss is converted to have the level vccx or vccx–vdd to become the switching signal SS1.

In consequence, it is possible to accomplish a relatively simple circuit arrangement by which the MOS transistors which form the inverters IV1 and IV2 having application of the high voltages vccx and vccx–vdd do not break down between the drain and source. It reduces the chip area as compared with the 2-stage level shifter of FIG. 7.

Figure 14:
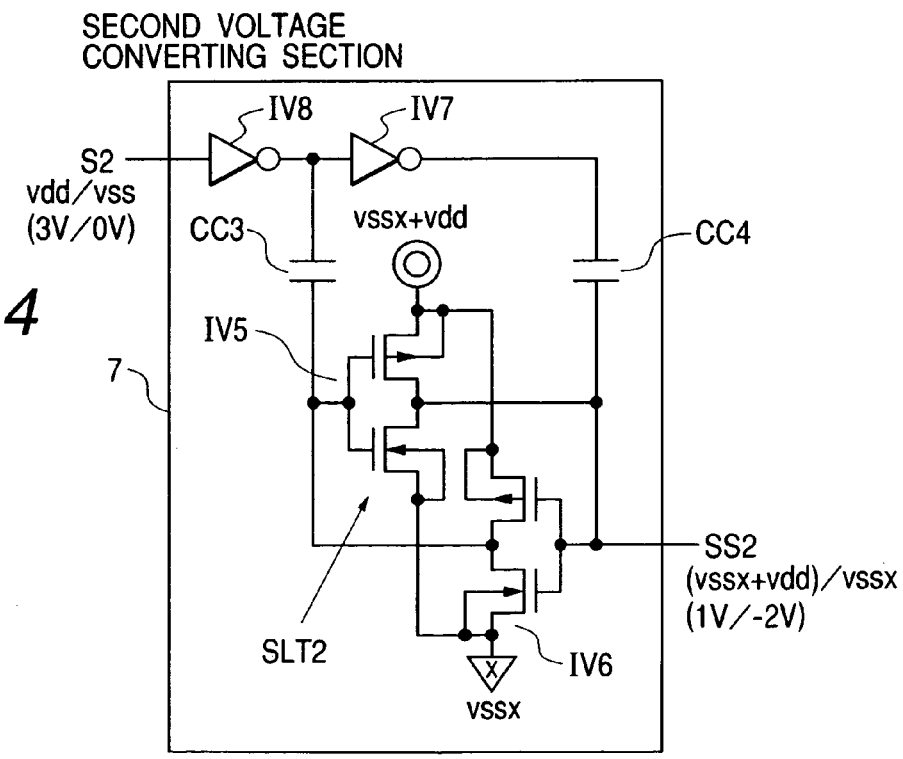
FIG. 14 is a circuit diagram showing an example of the second voltage converting section.

FIG. 14 shows an example of the second voltage converting section 7. The second voltage converting section 7 includes a static latch circuit SLT2 which includes multiple untiparallel-connected inverter circuits IV5 and IV6 which derive operational power from the source voltage vssx of the second MOS transistor and the voltage vssx+vdd which is higher than vssx by the amount of vdd. There are included a third coupling capacitor CC3 having one capacitive electrode coupled with one input/output node of the static latch circuit SLT2, and a fourth coupling capacitor CC4 having one capacitive electrode coupled with another input/output node of the static latch circuit. Connected between another capacitive electrode of the third coupling capacitor CC3 and another capacitive electrode of the fourth coupling capacitor CC4 is an inverter IV7 which derives operational power from the ground voltage vss and power voltage vdd, and connected, at the output, to the input of the inverter IV7 is another inverter IV8 which receives in the timing signal S2 and derives operational power from the ground voltage vss and power voltage vdd.

According to this second voltage converting section 7, when the second timing signal S2 which is input to the inverter IV8 changes between the ground voltage vss and the power voltage vdd, a varying component is delivered to a pair of input/output nodes of the static latch circuit via the coupling capacitors CC3 and CC4. Accordingly, the timing signal S2 having the level vdd or vss is converted to have the level vssx or vssx+vdd to become the switching signal SS2.

In consequence, it is possible to accomplish a relatively simple circuit arrangement by which the MOS transistors which form the inverters IV5 and IV6 having application of the high voltages vssx and vssx+vdd do not break down between the drain and source. It reduces the chip area as compared with the 2-stage level shifter of FIG. 7.

<High Voltage Generation Circuit>

Figure 15:
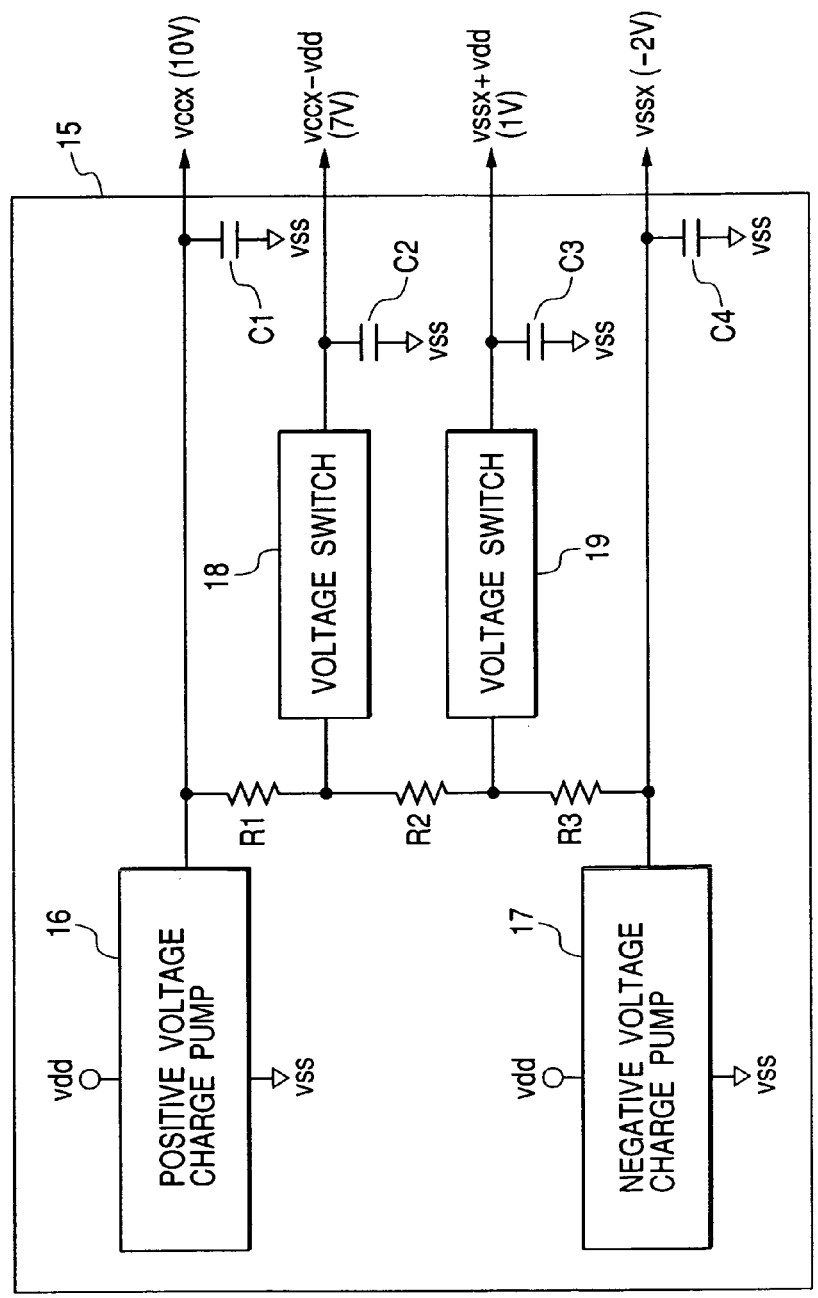
FIG. 15 is a circuit diagram illustrating the high voltage generation circuit.
Figure 16:
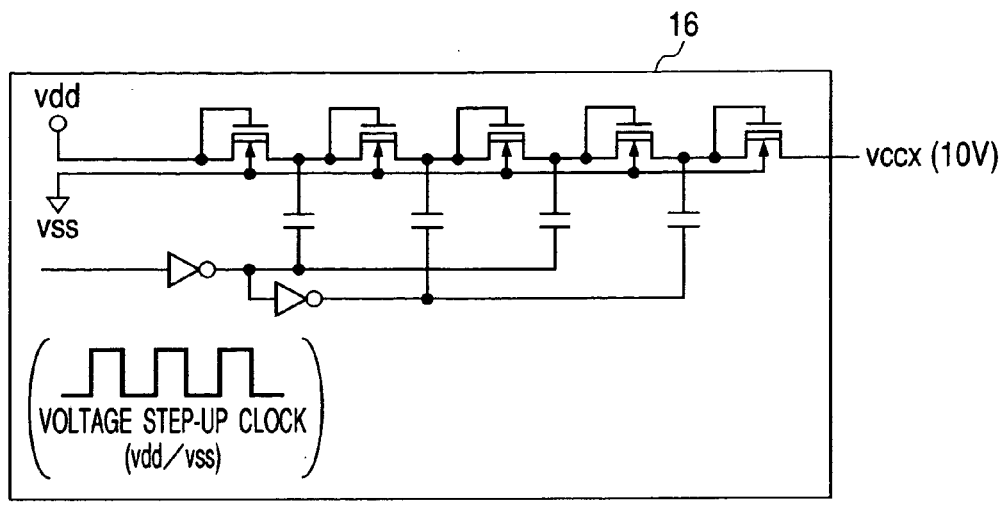
FIG. 16 is a circuit diagram illustrating the positive voltage charge pump circuit.
Figure 17:
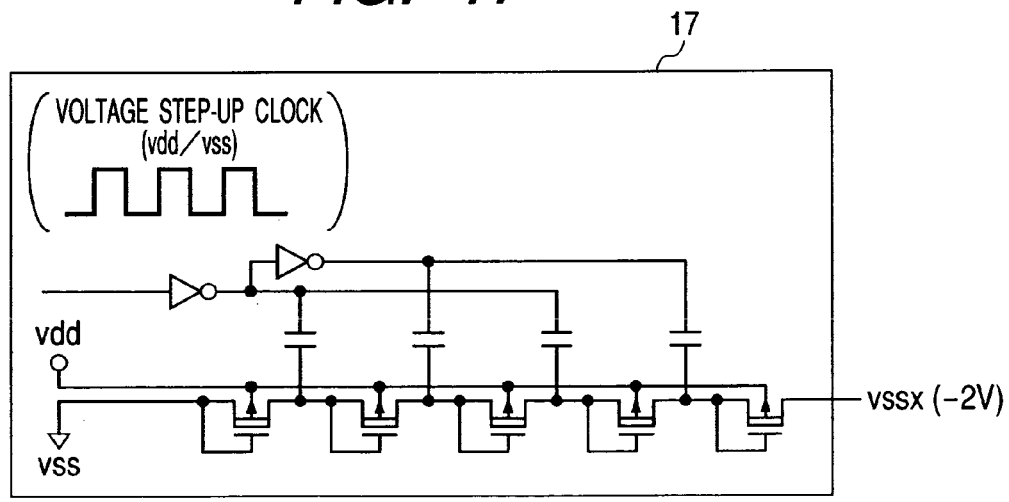
FIG. 17 is a circuit diagram illustrating the negative voltage charge pump circuit.

FIG. 15 illustrates a high voltage generation circuit. The high voltage generation circuit 15 includes a positive voltage charge pump circuit 16 and negative voltage charge pump circuit 17. The positive voltage charge pump circuit 16 derives its operational power from the ground circuit vss and power voltage vdd, and it implements the positive voltage step-up operation in synchronism with a voltage step-up clock to release a high voltage vccx (10 V) as illustrated in FIG. 16. The negative voltage charge pump circuit 17 derives its operational power from the ground voltage vss and power voltage vdd, and it implements the negative voltage step-up operation in synchronism with the voltage step-up clock to release a high voltage vssx (−2 V) as illustrated in FIG. 17. The step-up voltages vccx and vssx undergo voltage division by a voltage dividing resistor circuit made up of resistors R1, R2 and R3, and the circuit 15 releases the vccx (10 V), vccx–vdd (7 V), vssx+vdd (1 V), and vssx (−2 V). Indicated by C1, C2, C3 and C4 are smoothing capacitors (stabilizing capacitors) for the step-up voltages.

Figure 18:
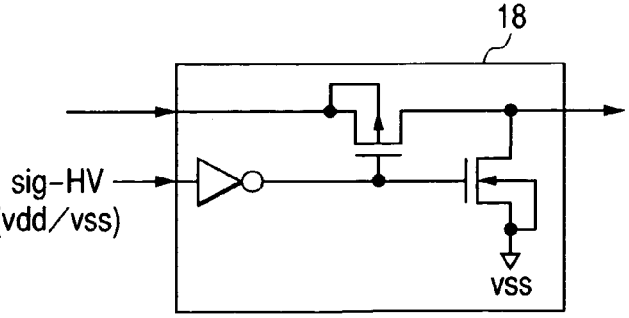
FIG. 18 is a circuit diagram illustrating the voltage switching circuit for low-voltage power which is supplied to the static latch of the first voltage converting section.
Figure 19:
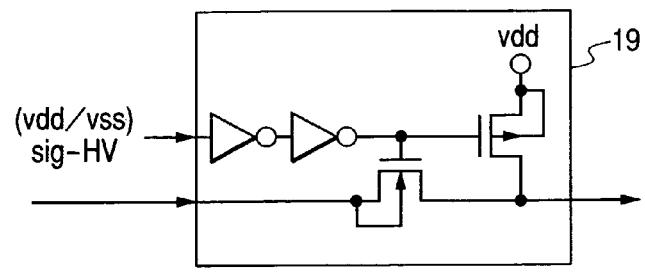
FIG. 19 is a circuit diagram illustrating the voltage switching circuit for high-voltage power which is supplied to the static latch of the second voltage converting section.

A power switching circuit 18, as shown in FIG. 18, operates to pull the output voltage down to the ground voltage vss when the voltage step-up operation by the charge pump circuits 16 and 17 ceases. Another power switching circuit 19, as shown in FIG. 19, operates to pull the output voltage down to the power voltage vdd when the voltage step-up operation by the charge pump circuits 16 and 17 ceases. Accordingly, the voltage converting sections 6 and 7 are prevented from releasing unstable output voltages at a halt of voltage step-up operation by the charge pump circuits 16 and 17.

<Bit Line Switching>

Figure 20:
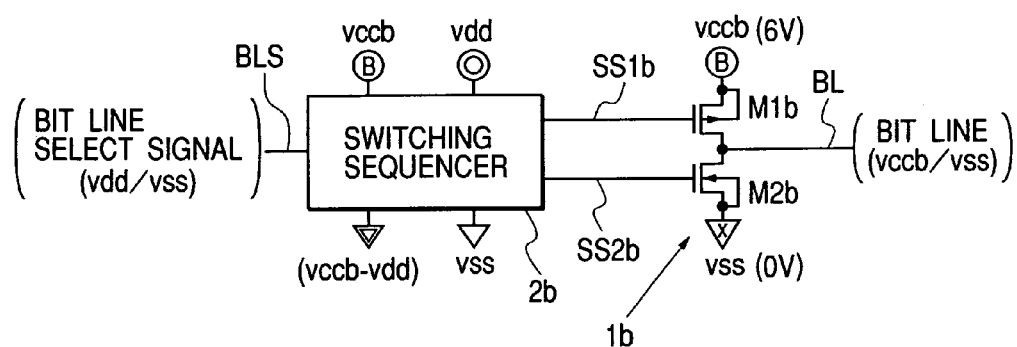
FIG. 20 is a block diagram illustrating a bit line driver which embodies the voltage output driver and a switching sequencer which embodies the output switching circuit of the semiconductor integrated circuit based on this invention.

FIG. 20 illustrates a bit line driver 1b which embodies the high voltage output driver and a switching sequencer 2b which embodies the output switching circuit of the semiconductor integrated circuit based on this invention. The bit line driver 1b derives its operational power from the circuit ground voltage vss and a high positive voltage vccb (6 V) generated by a high voltage generation circuit, and it is a series circuit of a first MOS transistor M1b of p-channel type and a second MOS transistor M2b of n-channel type, with the node of serial connection being connected as driver output terminal to a bit line BL. The first MOS transistor M1b has its gate electrode supplied with a first switching signal SS1b, and the second MOS transistor M2b has its gate electrode supplied with a second switching signal SS2b.

The switching sequencer 2b derives its operational power from the circuit ground voltage vss and power voltage vdd and the high positive voltage vccb (6 V) and intermediate voltage vccb−vdd generated by the high voltage generation circuit. The switching sequence 2b receives a bit line select signal BLS which embodies the switching command signal and changes between the power voltage vdd (3 V) and the circuit ground voltage vss (0 V), and it determines the levels of the first switching signal SS1b and second switching signal SS2b in accordance with the input signal levels. The bit line select signal BLS has its logic level determined in accordance with the value of data to be written. For example, in the memory cell write operation, the bit line BL connected to the drain region of a memory cell to be written is driven to the voltage vccb by the bit line driver 1b.

The switching sequencer 2b reverses the complementary switching states of the first MOS transistor M1b and second MOS transistor M2b such that one transistor in the on-state is switched to the off-state first and another transistor is switched to the on-state afterward. In consequence, even if the bit line driver 1b has its output reversed in the presence of application of the power voltage above the minimum breakdown voltage (BVds_min), the bit line driver 1b does not break down as in the case of FIG. 1.

<Source Line Switching>

Figure 21:
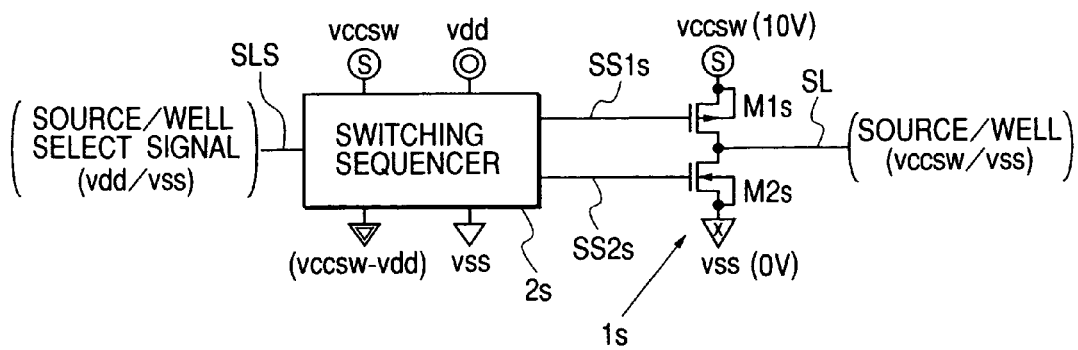
FIG. 21 is a block diagram illustrating a source line driver or well driver which embodies the high voltage output driver and a switching sequencer which embodies the output switching circuit of the semiconductor integrated circuit based on this invention.

FIG. 21 illustrates a source line driver 1s which embodies the high voltage output driver and a switching sequencer 2s which embodies the output switching circuit of the semiconductor integrated circuit based on this invention. The source line driver 1s derives its operational power from the circuit ground voltage vss and a high positive voltage vccsw (10 V) generated by a high voltage generation circuit, and it is a series circuit of a first MOS transistor M1s of p-channel type and a second MOS transistor M2s of n-channel type, with the node of serial connection being connected as driver output terminal to a source line SL. The first MOS transistor M1s has its gate electrode supplied with a first switching signal SS1s, and the second MOS transistor M2s has its gate electrode supplied with a second switching signal SS2s.

The switching sequencer 2s derives its operational power from the circuit ground voltage vss and power voltage vdd and the high positive voltage vccsw (10 V) and intermediate voltage vccsw−vdd generated by the high voltage generation circuit. The switching sequencer 2s receives a source line select signal SLS which embodies the switching command signal and changes between the power voltage vdd (3 V) and the circuit ground voltage vss (0 V), and it determines the levels of the first switching signal SS1s and second switching signal SS2s in accordance with the input signal levels. The source line select signal SLS has its logic level determined in accordance with specified data of the erasing area. For example, in the memory cell erase operation, the source line SL connected to the source region of a memory cell to be erased is driven to the voltage vccsw (10 V) by the source line driver 1s. The word line connected to the control gate of the memory cell has application of 3 V for example.

The switching sequencer 2s reverses the complementary switching states of the first MOS transistor M1s and second MOS transistor M2s such that one transistor in the on-state is switched to the off-state first and another transistor is switched to the on-state afterward. In consequence, even if the source line driver 1s has its output reversed in the presence of application of the power voltage vccsw above the minimum breakdown voltage (BVds_min), the source line driver 1s does not break down as in the case of FIG. 1.

The circuit arrangement of FIG. 21 is also applicable to the well voltage line driver and associated switching sequencer for driving a well voltage line of a well region as a semiconductor region where a non-volatile memory cell is formed. In the entire erasing operation of all memory cells, the voltage vccsw is supplied to the well voltage lines as well as the source lines, or in place of the source lines.

<Consideration of Verification Operation>

Figure 22:
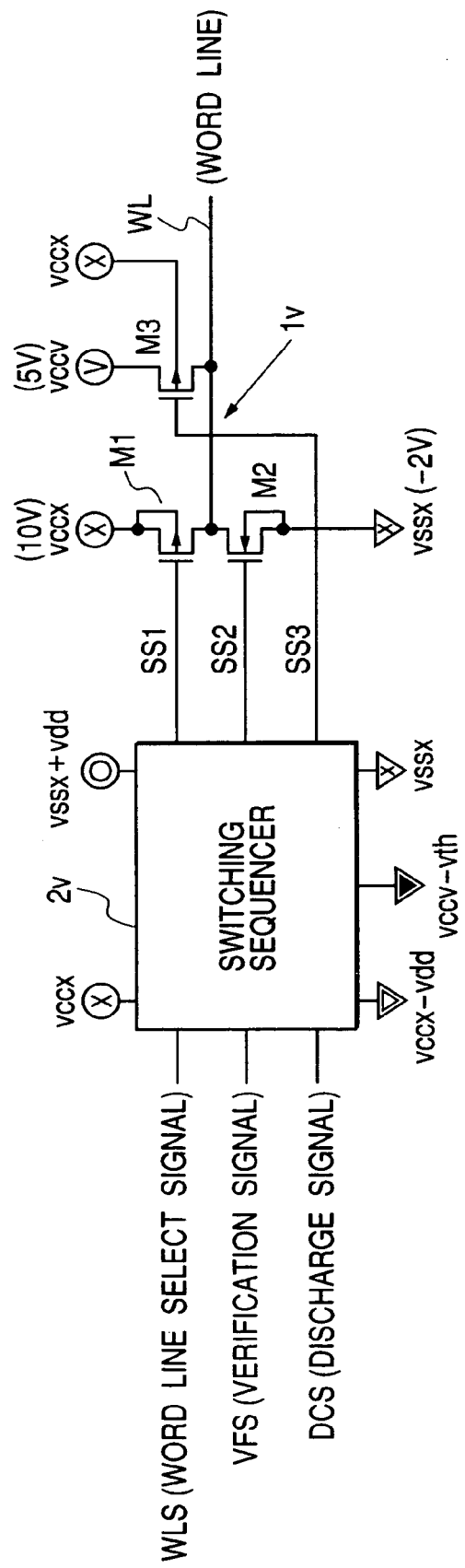
FIG. 22 is a block diagram illustrating a word line driver and switching sequencer which are designed in consideration of the post-writing verification operation.

FIG. 22 illustrates a word line driver and switching sequencer which are designed in consideration of the post-writing verification operation. The circuit differs from FIG. 1 in the arrangement of a word line driver 1v, which is provided with a third MOS transistor M3 of p-channel type, which is adapted to feed a word line voltage vccv (5 V) for verification to the word line WL which is connected to the node of the serial connection of the first and second MOS transistors M1 and M2. The third MOS transistor M3 is controlled for switching by a third switching signal SS3. The substrate of the third MOS transistor M3 has application of the high voltage vccx (10 V).

The switching sequencer 2v derives its operational power from the vccx (10 V), vssx+vdd (1 V), vccx−vdd (7 V), vccv−vth, and vssx (−2 V), and it outputs switching control signals SS1, SS2 and SS3. The voltage vth signifies the threshold voltage in absolute value of the MOS transistor M3. The switching sequencer 2v operates in response to the instruction of verification operation indicated by a verification signal VFS and discharge signal DCS to turn off the first MOS transistor M1 and second MOS transistor M2 of the high voltage output driver 1v which is connected to the word line WL and operates on the third MOS transistor M3 to feed the verification word line voltage vccv (5 V) to the corresponding word line WL. In consequence, even in the case of feeding the verification voltage vccv to the word line WL, it is not necessary to apply and cease the application of high-voltage operational power vccx (10 V) to the high voltage output driver 1v or halt the voltage step-up operation of the high voltage generation circuit such as a charge pump. In the case of adopting the write/erase scheme which is not accompanied by the verification operation, the third MOS transistor M3 shown in FIG. 22 is not required.

Figure 23:
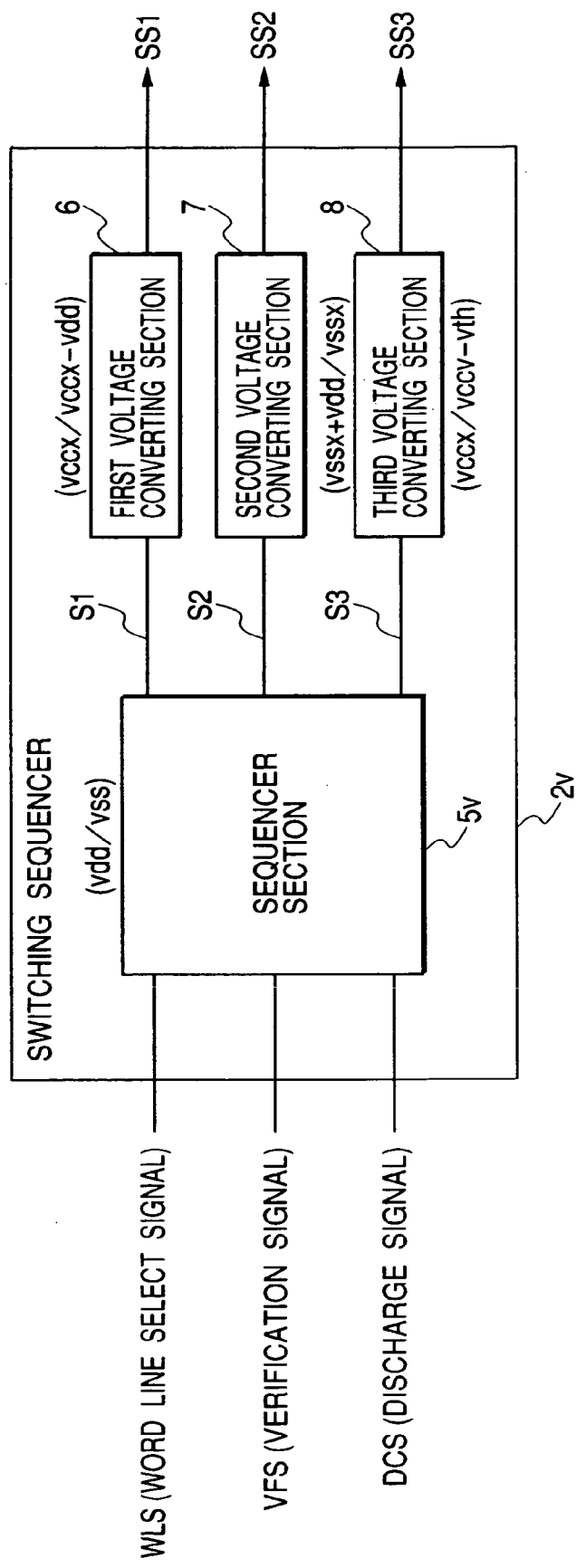
FIG. 23 is a block diagram showing a specific example of the switching sequencer.

FIG. 23 shows a specific example of the switching sequencer 2v. The switching sequencer 2v includes a sequencer section 5v which receives the word line select signal WLS, verification signal VFS and discharge signal DCS and outputs a first timing signal S1, second timing signal S2 and third timing signal S3, and, in addition to the first and second voltage converting sections 6 and 7, a third voltage converting section 8 which takes in the third timing signal S3 and outputs a third switching signal SS3 for the third MOS transistor M3. The third switching signal SS3 is a signal which changes in a range of vccx−vccv+vth downwardly from the source voltage vccx of the first MOS transistor M1. The third voltage converting section 8 is similar in circuit arrangement to the one shown in FIG. 13, and uses operational power vccv−vth in place of vccx−vdd.

Figure 24:
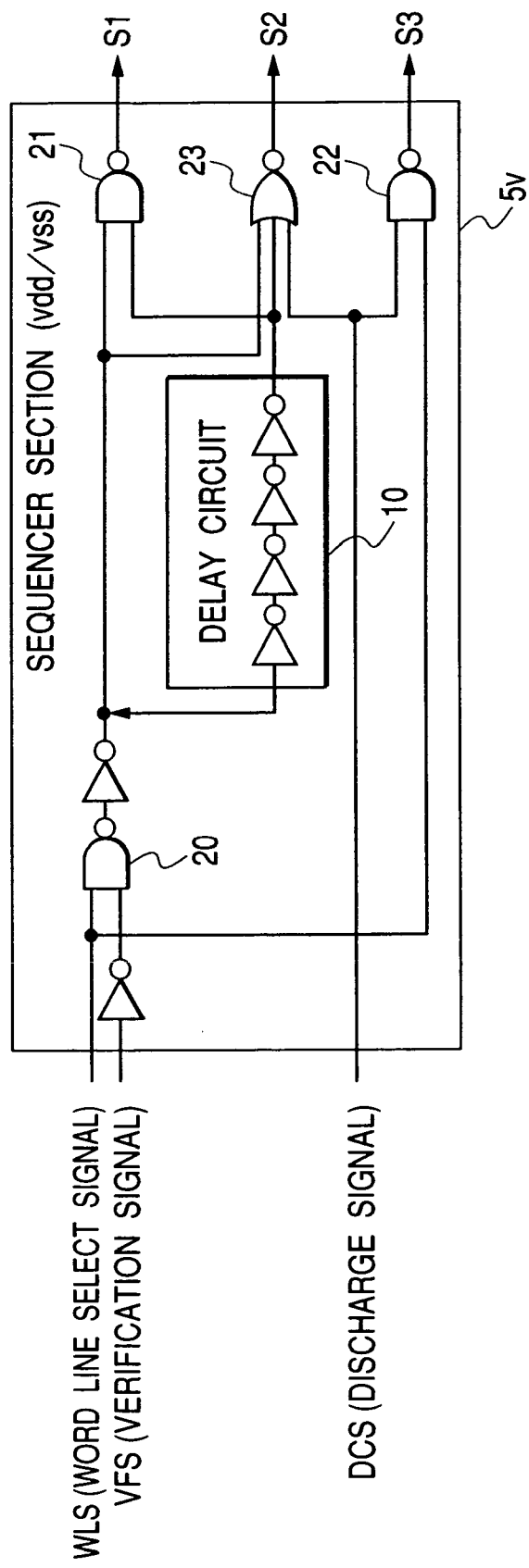
FIG. 24 is a logic circuit diagram showing an example of the sequencer section of FIG. 23.

FIG. 24 shows an example of the sequencer section 5v. Indicated by 20, 21 and 22 are 2-input NAND gates, and 23 is a 3-input NOR gate.

Figure 25:
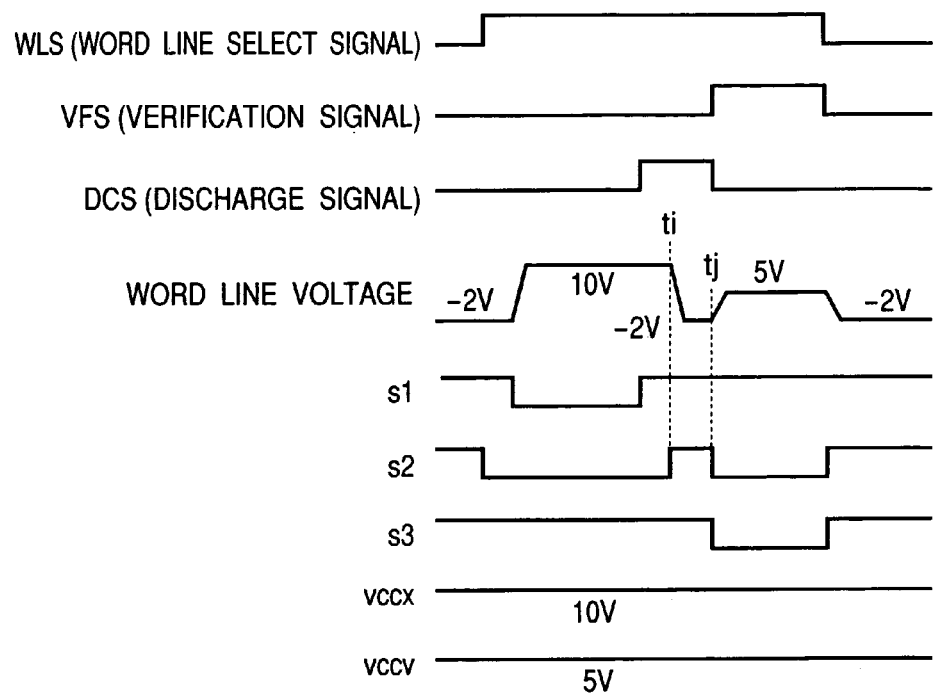
FIG. 25 is a waveform diagram of the timing signals S1, S2 and S3 produced by the sequencer section of FIG. 24.

FIG. 25 illustrates the signal waveforms of the timing signals S1, S2 and S3 produced by the sequencer section 5v of FIG. 24. When the timing signals S1 and S2 change from the high level to the low level, the transition of the signal S2 proceeds to time the turn-off of the on-state second transistor M2 first, and when the timing signals S1 and S2 change from the low level to the high level, the transition of the signal S1 proceeds to time the turn-off of the on-state first transistor M1 first. When verification takes place, the word line WL is once discharged to vssx, and then driven to vccv (5 V). It is obvious from the figure that the voltages vccx (10 V) and vccv (5 V) do not need the rendition of level change during the operation.

Figure 26:
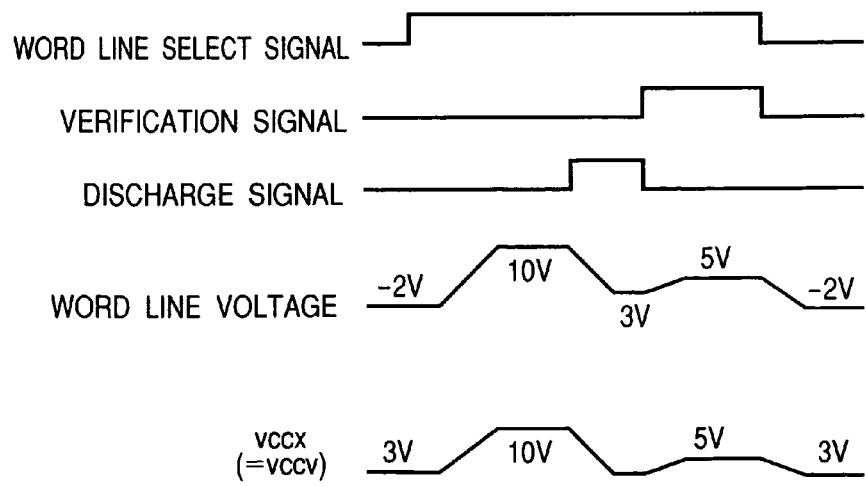
FIG. 26 is a waveform diagram as a comparative example with respect to FIG. 25, showing the state of high-voltage power vccx of the case when a word line is driven to the verification voltage (5 V) at the time of verification by using a word line driver in CMOS inverter configuration having a common input as shown in FIG. 6.

FIG. 26 illustrates, as a comparative example with respect to FIG. 25, the state of high-voltage power vccx of the case when the word line is driven to the verification voltage (5 V) at the time of verification by using a word line driver in CMOS inverter configuration having a common input as shown in FIG. 6. The word line voltage needed for the write operation is 10 V, while the word line voltage needed for the verification operation is 5 V, and therefore the word line driver has its high-voltage power vccx changed in order to get these word line voltages. For preventing the occurrence of the above-mentioned breakdown at the voltage change, the high-voltage power vccx is once stepped down to 3 V, and thereafter rendered the charging operation by expending time.

Figure 27:
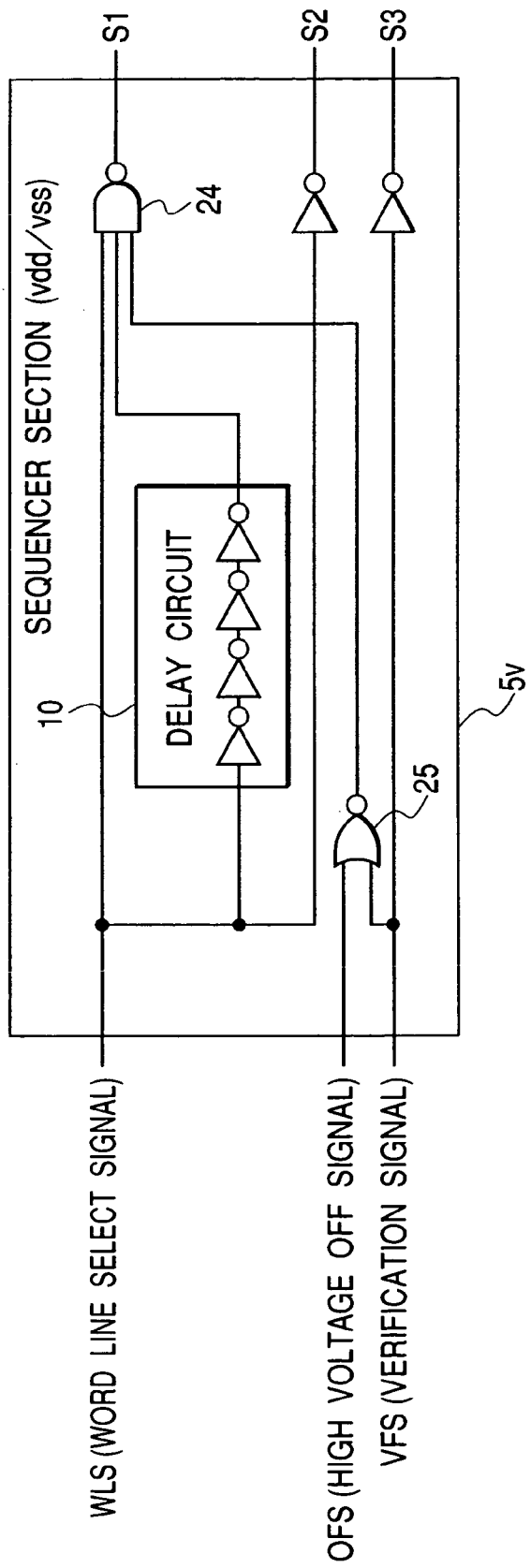
FIG. 27 is a logic circuit diagram showing another example of the sequencer section of FIG. 23.

FIG. 27 shows another example of the sequencer section 5v. Indicated by 24 is a 3-input NAND gate, and 25 is a 2-input NOR gate. The circuit receives a high voltage off signal OFS in place of the discharge signal DCS.

Figure 28:
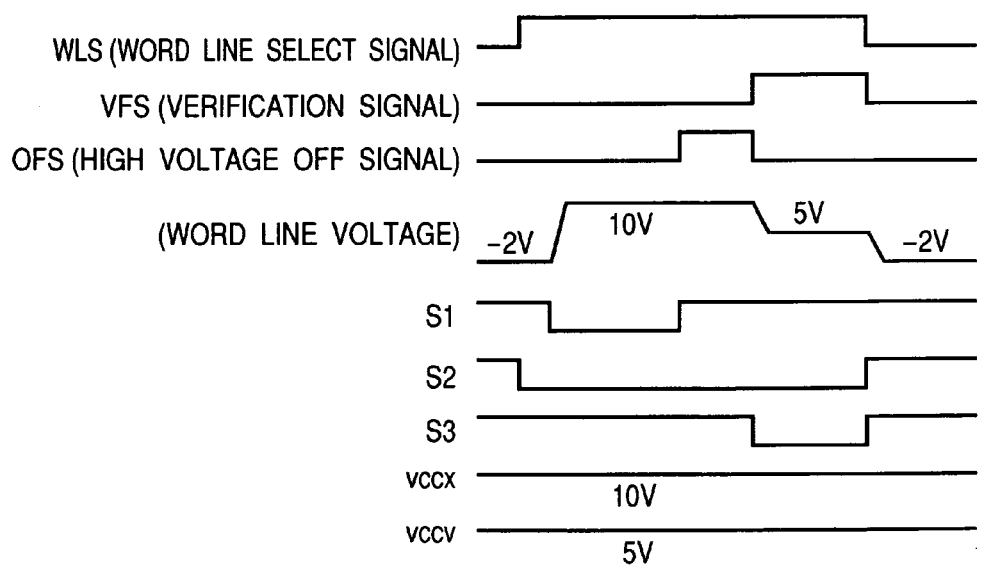
FIG. 28 is a waveform diagram of the timing signals S1, S2 and S3 produced by the sequencer section of FIG. 27.

FIG. 28 illustrates the signal waveforms of timing signals S1, S2 and S3 produced by the sequencer section 5v of FIG. 27. The waveforms differ from those of FIG. 25 in the elimination of the discharge operation which takes place between time ti and time tj of FIG. 25. Also in this example, when the timing signals S1 and S2 change from the high level to the low level, the transition of the signal S2 proceeds to time the turn-off of the on-state second transistor M2 first, and when the timing signals S1 and S2 change from the low level to the high level, the transition of the signal S1 proceeds to time the turn-off of the on-state first transistor M1 first. When verification takes place, the word line WL is driven to vccv (5 V) without being discharged to vssx. It is obvious from the figure that the voltages vccx (10 V) and vccv (5 V) do not need to repeat step-down and step-up during the operation.

Figure 29:
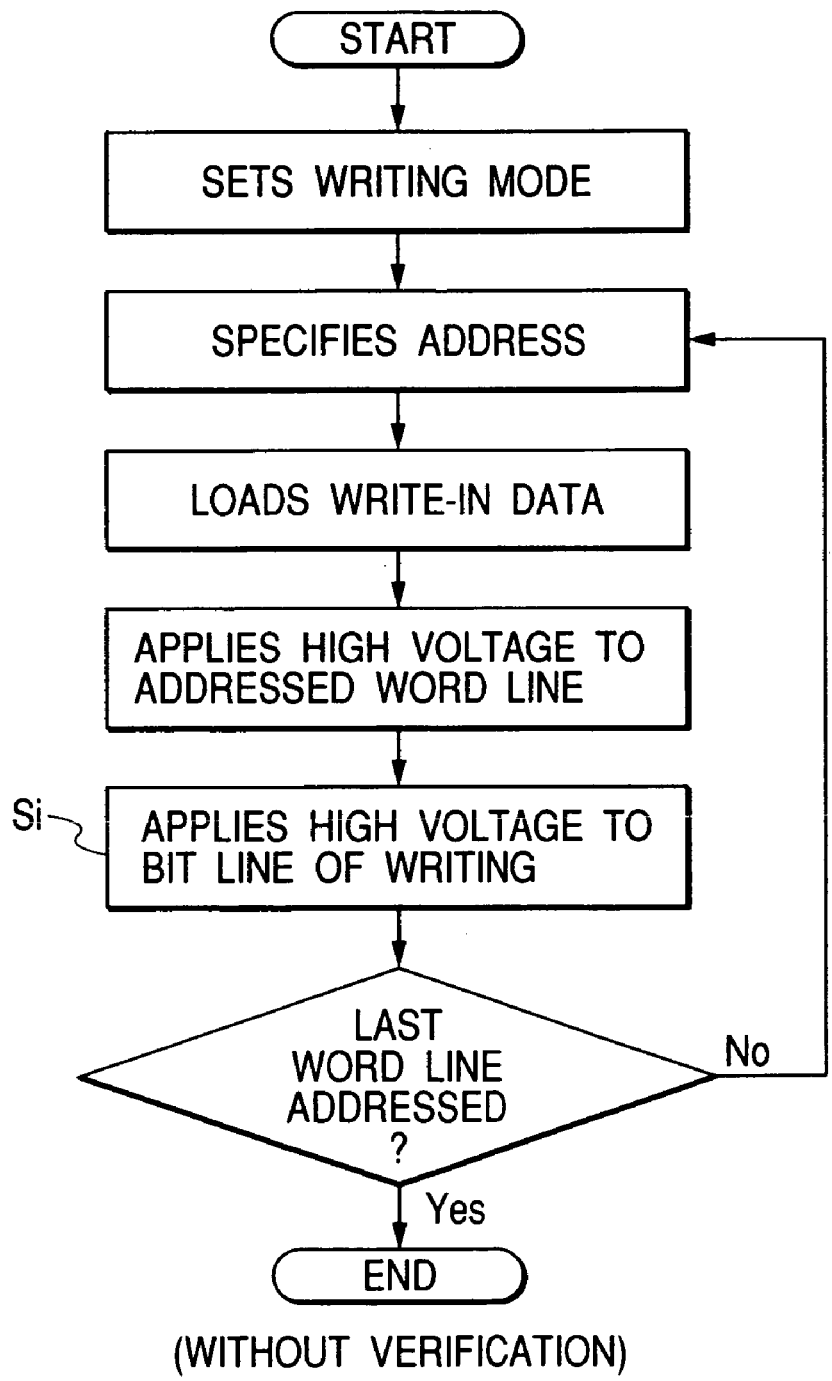
FIG. 29 is a flowchart illustrating the write operation which is not accompanied by the verification operation.
Figure 30:
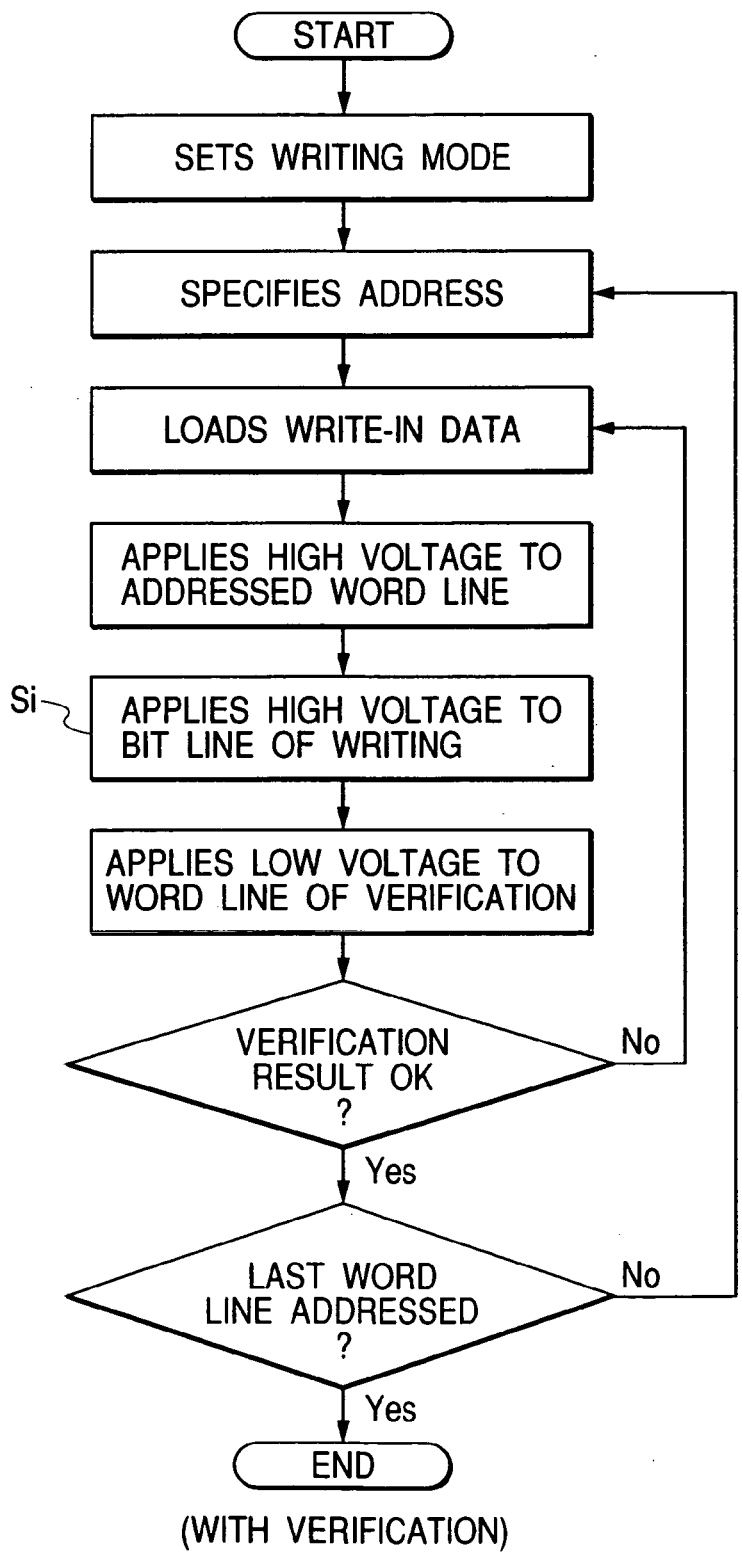
FIG. 30 is a flowchart illustrating the write operation which is accompanied by the verification operation.

FIG. 29 illustrates by flowchart the write operation which is not accompanied by the verification operation. FIG. 30 illustrates by flowchart the write operation which is accompanied by the verification operation. In the flowcharts of FIG. 29 and FIG. 30, in case word lines of writing are switched following the writing process (Si) with application of the writing high voltage to the word line, or in case the verification operation is implemented at the voltage which is lower relative to the writing voltage, it is not necessary to discharge the high voltage supply node itself. The conventional case necessitates a processing step for discharging high-voltage power after the writing process (Si).

<Flash Memory>

Figure 31:
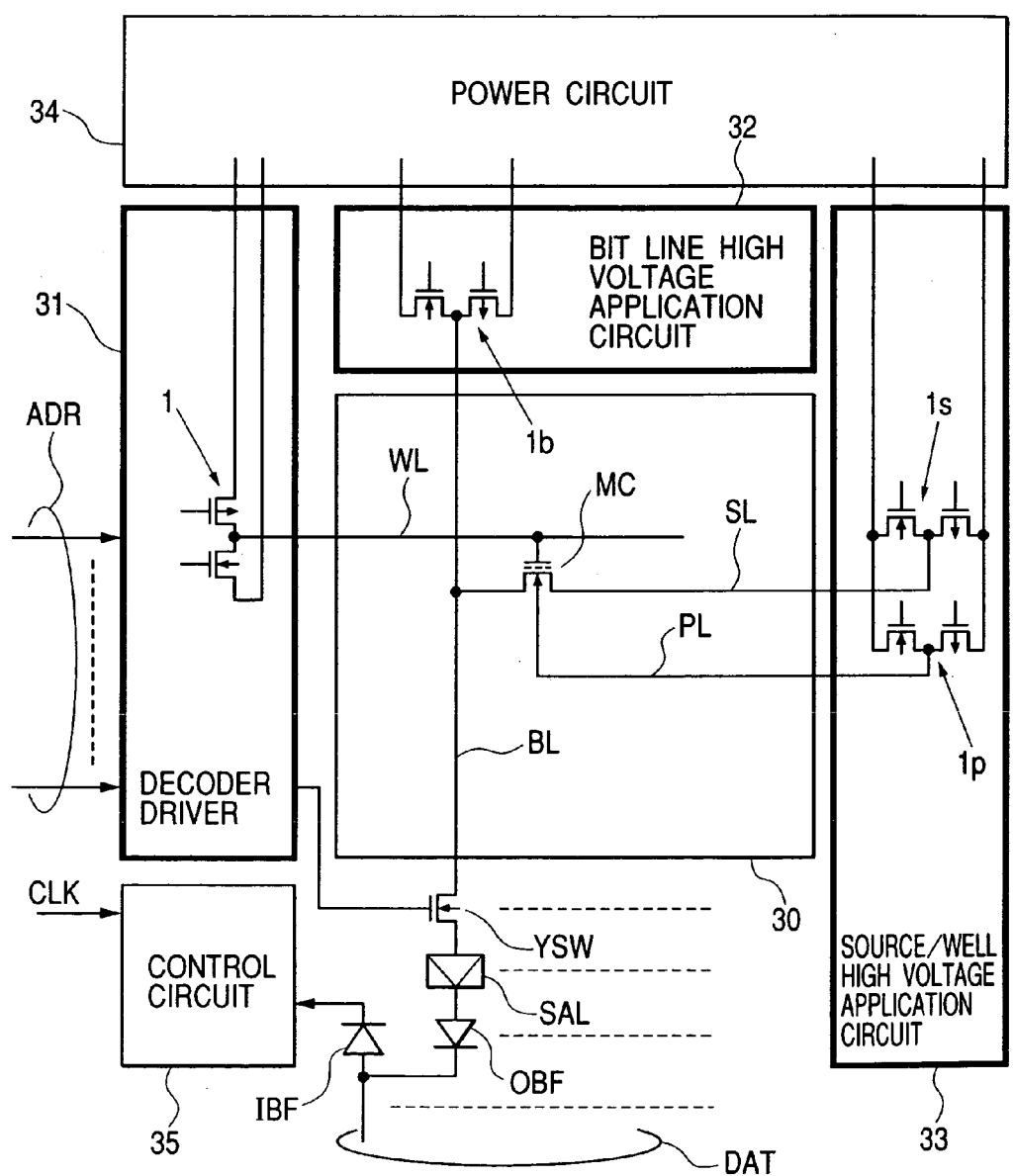
FIG. 31 is a block diagram illustrating in brief the arrangement of a non-volatile memory, mainly high voltage drivers thereof, which is an example of the semiconductor integrated circuit based on this invention.
Figure 32:
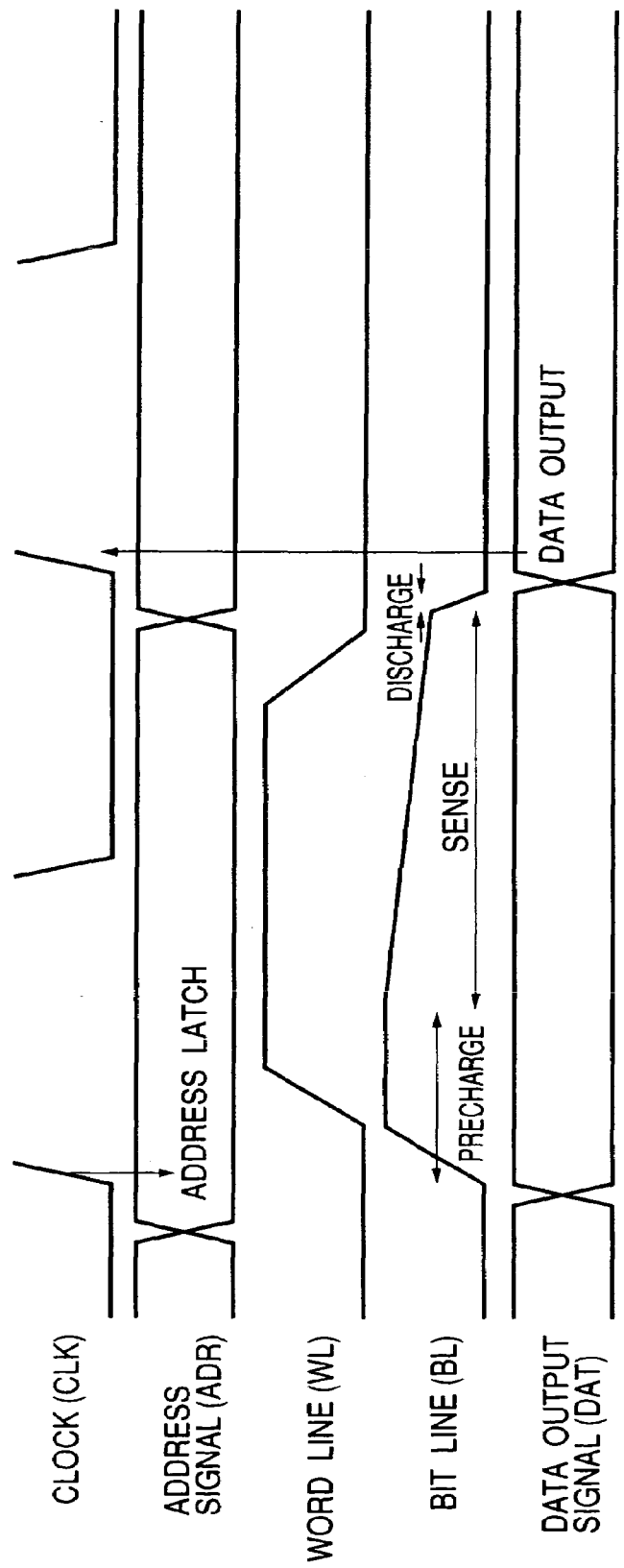
FIG. 32 is a timing chart illustrating the data read-out operation of the non-volatile memory of FIG. 31.

FIG. 31 illustrates in brief the arrangement of a non-volatile memory, mainly high voltage drivers thereof, which is an example of the semiconductor integrated circuit based on this invention. Non-volatile memory cells (flash memory cells) MC described previously are laid out on a memory mat 30. The figure shows one non-volatile memory cell MC as representation. The non-volatile memory cell MC has its control gate connected to a word line WL, its drain connected to a bit line BL, its source connected to a source line SL, and its well region connected to a substrate voltage feed line PL. In response to the access operation to the non-volatile memory, a decoder driver 31 operates on its word line driver 1 to drive the word line WL, a bit line high voltage application circuit 32 operates on its bit line driver 1b to drive the bit line BL, and a source/well high voltage application circuit 33 operates on its source line drive 1s and substrate voltage feed line driver 1p to drive the source line SL and substrate voltage feed line PL. These drivers are supplied with their operational power from a power circuit 34. Data read out from the memory cell MC to the bit line BL is conducted to a data bus DAT via a Y switch YSW, sense latch SAL and output buffer OBF. FIG. 32 illustrates the data read-out timing.

Data to be written or data of erasure block addressing which is supplied through the data bus DAT is input to a control circuit 35 via an input buffer IBF. The control circuit 35 controls the memory in synchronism with a clock signal CLK. For example, the control circuit 35 operates on the bit line driver 1b to control the bit line driving in accordance with the write-in data. The control circuit 35 also operates on the source line driver 1s and substrate voltage feed line driver 1p to control the driving of source line and substrate voltage feed line in accordance with the erasure block addressing data. Word line driving by the word line driver 1 is controlled in accordance with the address signal supplied through an address bus ADR.

Figure 33:
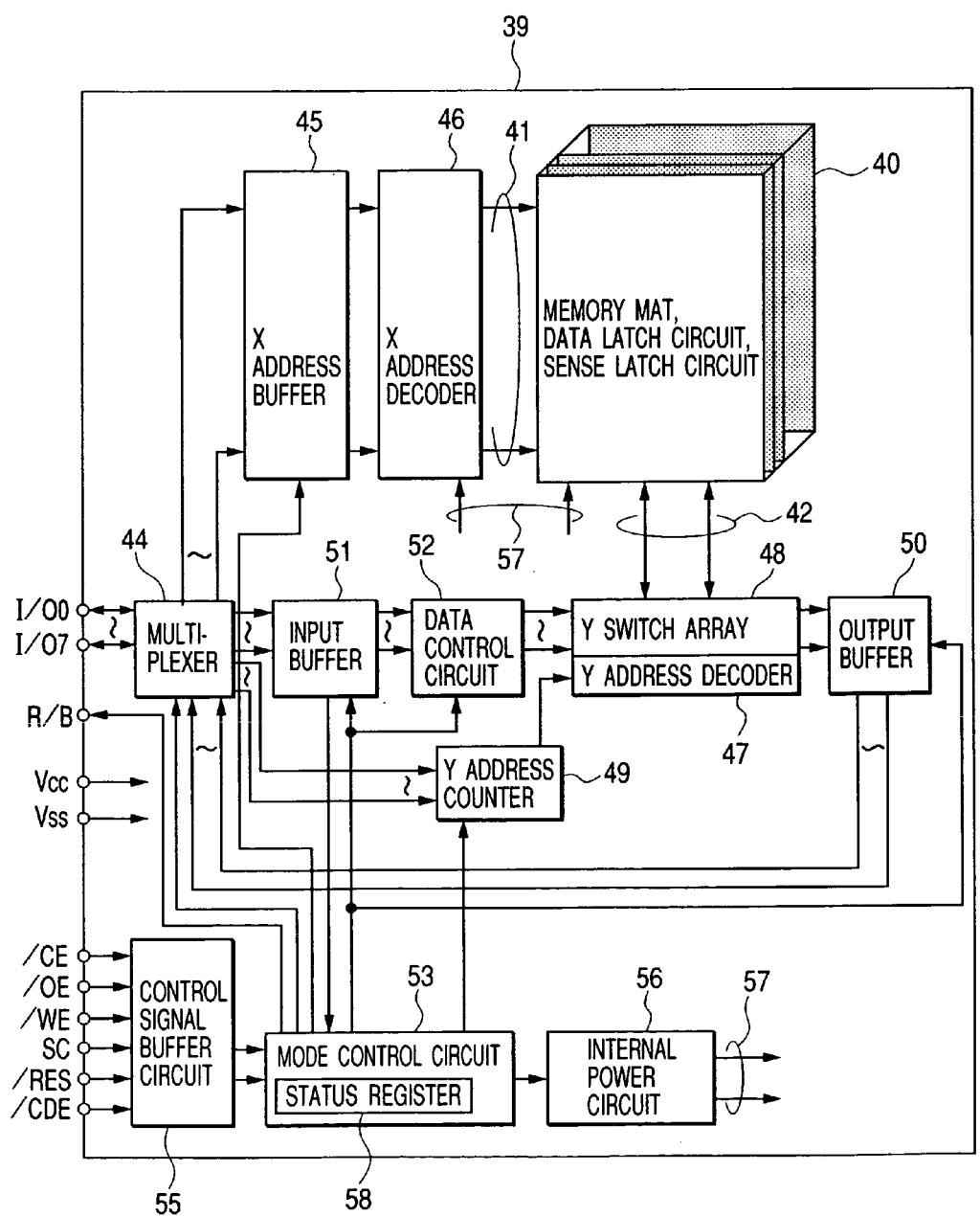
FIG. 33 is a block diagram showing a non-volatile memory, primarily the overall arrangement thereof, which is an example of the semiconductor integrated circuit based on this invention.

FIG. 33 shows a flash memory, primarily the overall arrangement thereof, as a non-volatile memory which is an example of the semiconductor integrated circuit based on this invention.

The flash memory 39 consists of a memory cell array 40 which is a matrix arrangement of non-volatile memory cells described previously, and a memory control circuit which operates in response to the external access instruction to control the read operation, erase operation and write operation of the non-volatile memory cells. In this example, all circuit sections excluding the memory cell array 40 fall into a memory control circuit.

The memory cell array 40 includes a memory mat, data latch circuit, and sense latch circuit. The memory mat includes numerous non-volatile memory cells which are electrically erasable and writable and are represented by the above-mentioned memory cell MC. The non-volatile memory cells have their control gates connected to corresponding word lines 41, their drains connected to corresponding bit lines 42, and their sources connected to source lines (not shown). The memory cells each store information in terms of threshold voltages against the word line voltage (control gate application voltage) for data read-out. A low threshold voltage of the memory cell transistor is here referred to as the erased state and a high threshold voltage is here referred to as the written state, although this is not compulsory. The definitions of written state and erased state, which are a relative concept, can be opposite to the above definitions.

The flash memory 39 has its external input/output terminals I/O0–I/O7 used commonly for the address input terminals, data input terminals, data output terminals, and command input terminals. An X address signal entered through the external input/output terminals I/O0–I/O7 is input to an X address buffer 45 via a multiplexer 44. An X address decoder 46 decodes the internal complementary address signals output from the X address buffer 45 to drive the word lines 41.

The sense latch circuit is located on one end of the bit lines 42, and the data latch circuit is located on another end of the bit lines 42. The bit lines 42 are selected by a Y switch array 48 in accordance with the select signal output from a Y address decoder 47. A Y address signal entered through the external input/output terminals I/O0–I/O7 is preset in a Y address counter 49, and the address signal which is incremented successively from the preset value is input to the Y address decoder 47.

Bit lines selected by the Y switch array 48 are made conductive to the input terminals of an output buffer 50 in the data output operation, made conductive to the output terminals of a data control circuit 52 via an input buffer 51 in the data input operation. Connection among the output buffer 50, input buffer 51 and input/output terminals I/O0–I/O7 is controlled by the multiplexer 44. A command supplied from the input/output terminals I/O0–I/O7 is input to a mode control circuit 53 via a multiplexer 104 and input buffer 111.

A control signal buffer circuit 55 receives, as access control signals, a chip enable signal /CE, output enable signal /OE, write enable signal /WE, serial clock signal SC, reset signal signal /RES, and command enable signal /CDE. Symbol "/" attached to the head of signal names signifies low-enable. Depending on the states of these signals, the mode control circuit 53 controls the function of signal interface with the outside through the multiplexer 44, etc. Command input from the input/output terminals I/O0–I/O7 is synchronized with the command enable signal /CDE. Data input is synchronized with the serial clock signal SC. Address information which is input is synchronized with the write enable signal /WE. The mode control circuit 53 responds to the instruction, in terms of command code, of the commencement of erase or write operation to access and output to the outside a ready/busy signal R/B indicative of amid erasing or writing operation.

An internal power circuit (internal voltage generation circuit) 56 generates operational power 57 of various internal voltages used for writing, erasing, verification, and read-out, and supplies the power to the X address decoder, memory cell array 40, etc.

The mode control circuit 53 controls the whole flash memory in accordance with input commands. The operation of the flash memory 39 is basically determined by commands. Commands of flash memory 39 include a read-out command, write command, etc. For example, a read-out command includes a read-out command code, read-out X address, and certain Y address. A write command includes a write command code, write X address, certain Y address, and write-in data.

The flash memory 39 has a status register 58 for indicating the memory internal states, and the register contents can be read out through the input/output terminals I/O0–I/O7 by aserting the signal /OE.

The flash memory 39 switches word lines of writing without stepping down the voltage step-up nodes of the high-voltage operational power vccx, vssx, etc. which have been explained previously. Accordingly, the flash memory 39 can accomplish the breakdown prevention of MOS transistors, speed-up of write operation, and reduction of power consumption.

Figure 34:
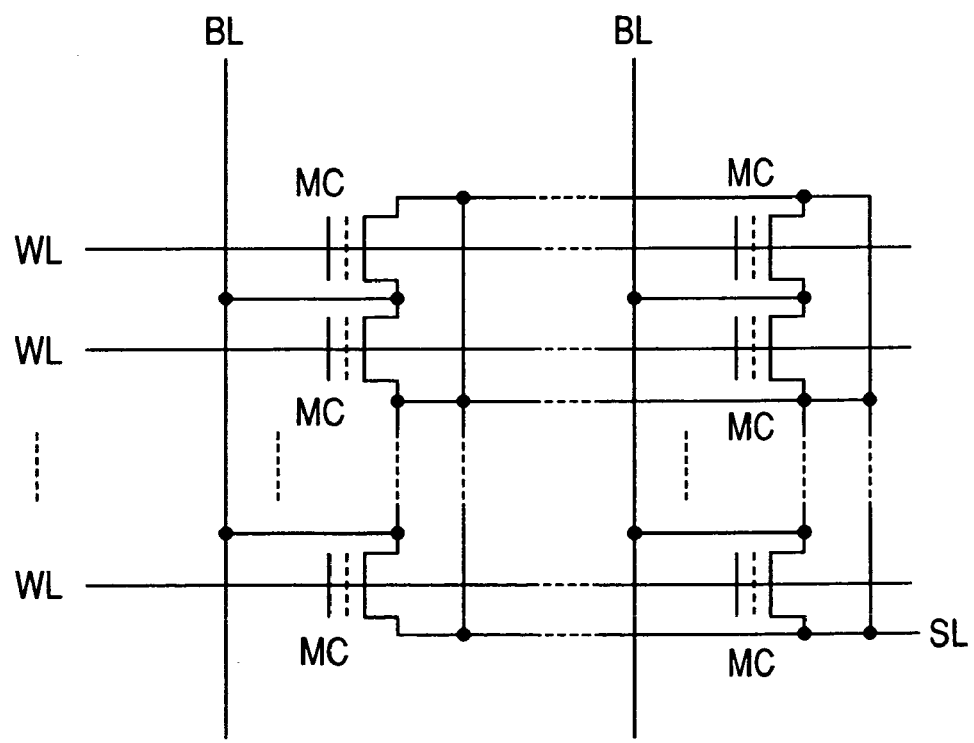
FIG. 34 is a circuit diagram illustrating the memory cell arrangement in NOR-type configuration of the memory array.
Figure 35:
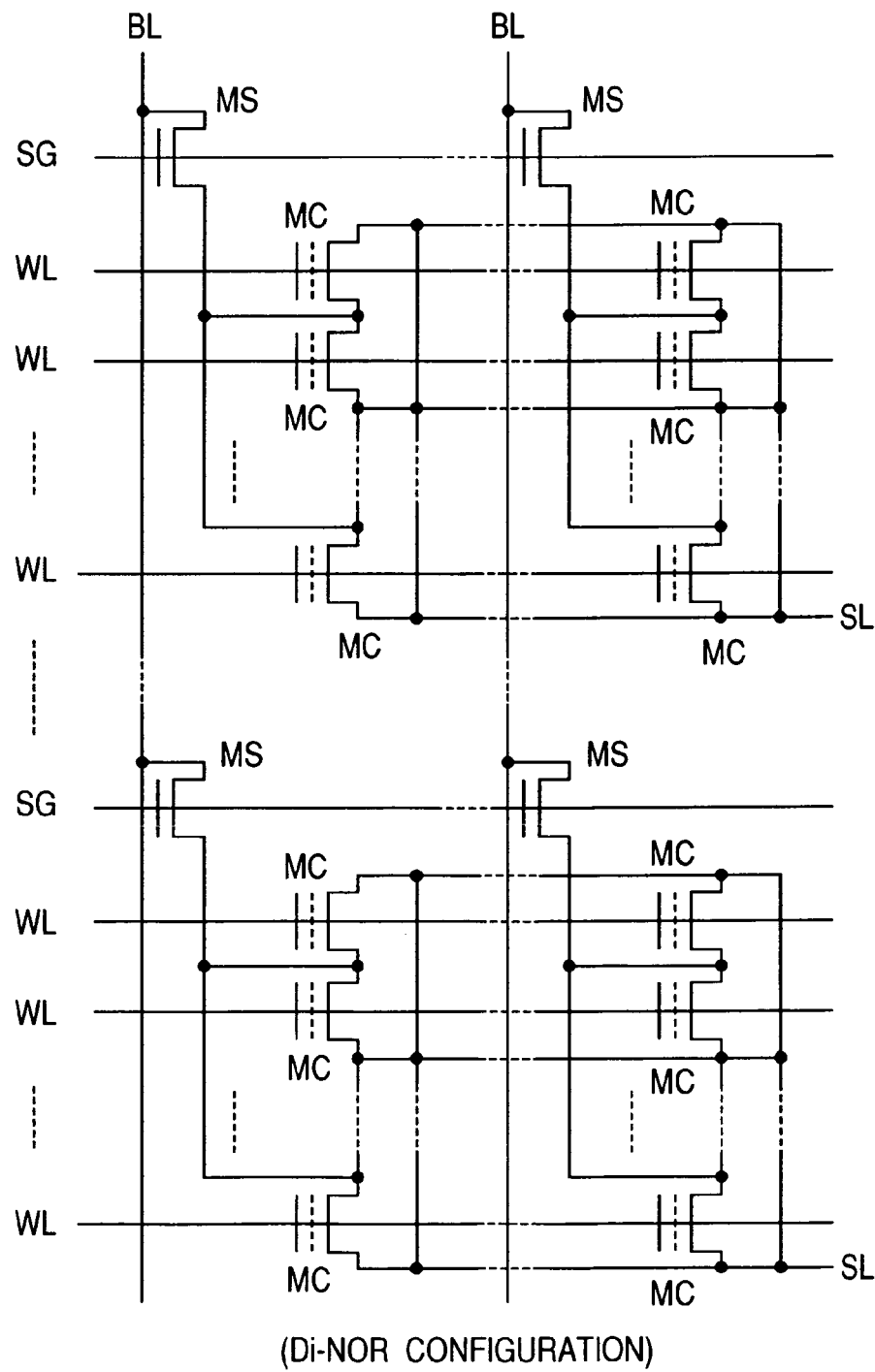
FIG. 35 is a circuit diagram illustrating the memory cell arrangement in Di-NOR-type configuration of the memory array.
Figure 36:
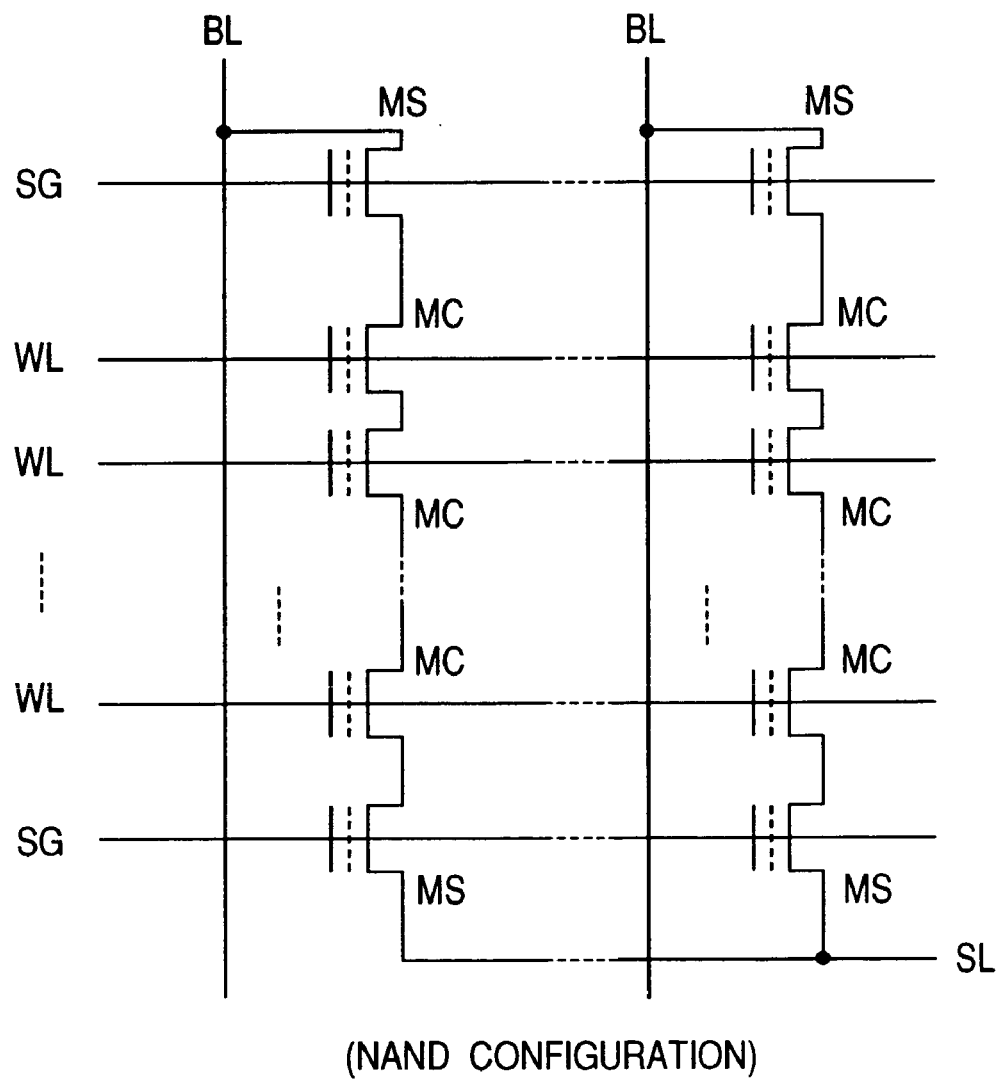
FIG. 36 is a circuit diagram illustrating the memory cell arrangement in NAND-type configuration of the memory array.
Figure 37:
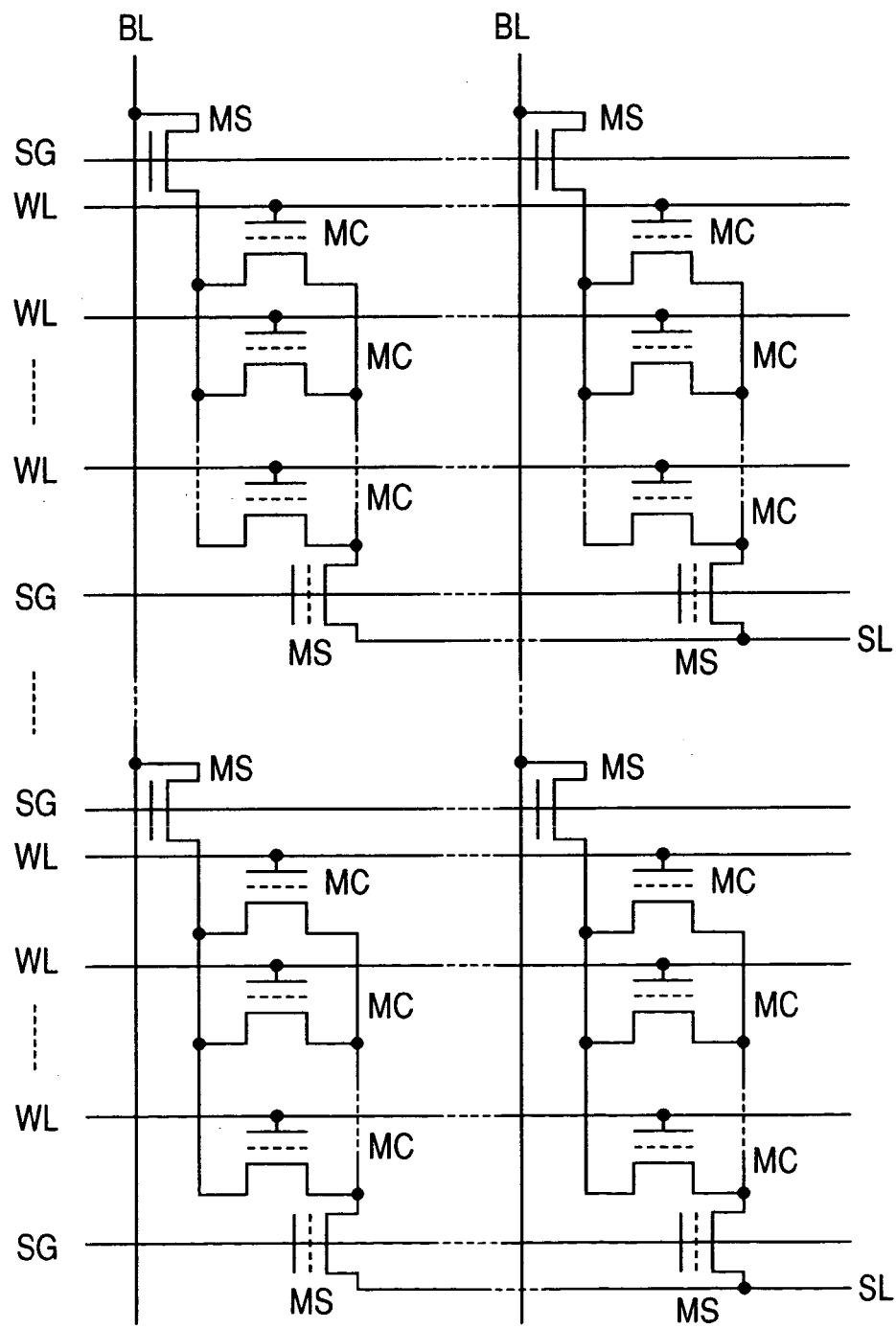
FIG. 37 is a circuit diagram illustrating the memory cell arrangement in AND-type configuration of the memory array.

The memory cell array 40 can have its memory cell arrangement selected from among a NOR configuration of FIG. 34, Di-NOR configuration of FIG. 35, NAND configuration of FIG. 36, and AND configuration of FIG. 37. The configurations of FIG. 35, FIG. 36 and FIG. 37 adopt a divisional bit line scheme, in which memory cells MC of each block are connected to a bit line through a selecting MOS transistor MS, thereby reducing the parasitic capacitance of bit lines BL.

Figure 38:
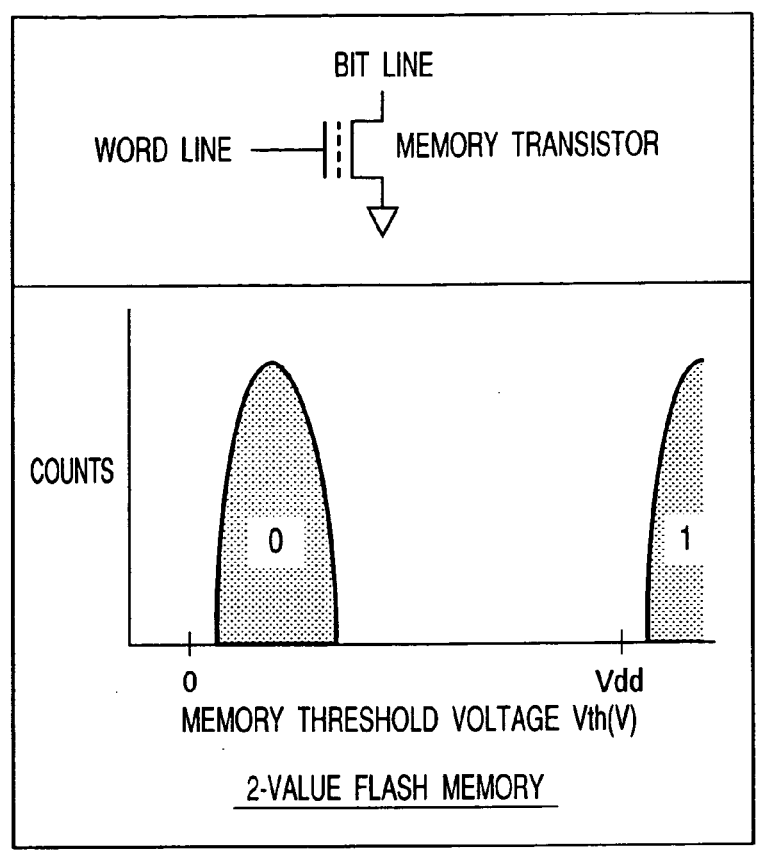
FIG. 38 is an explanatory diagram of a memory cell which adopts the scheme of storing 2-value information, i.e., 1-bit information, with one transistor.
Figure 39:
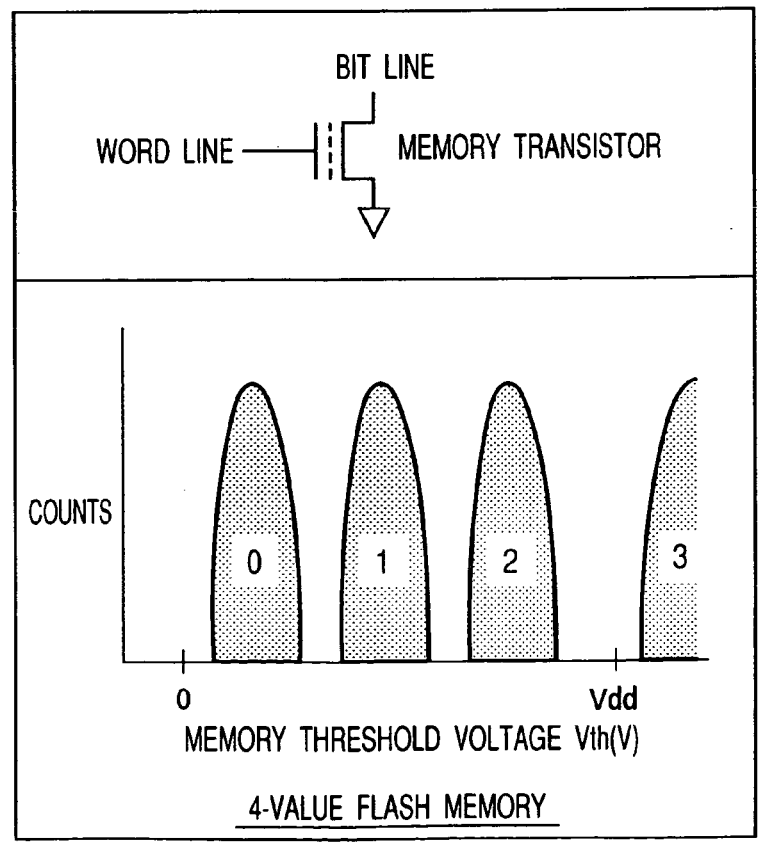
FIG. 39 is an explanatory diagram of a memory cell which adopts the scheme of storing 4-value information, i.e., 2-bit information, with one transistor.
Figure 40:
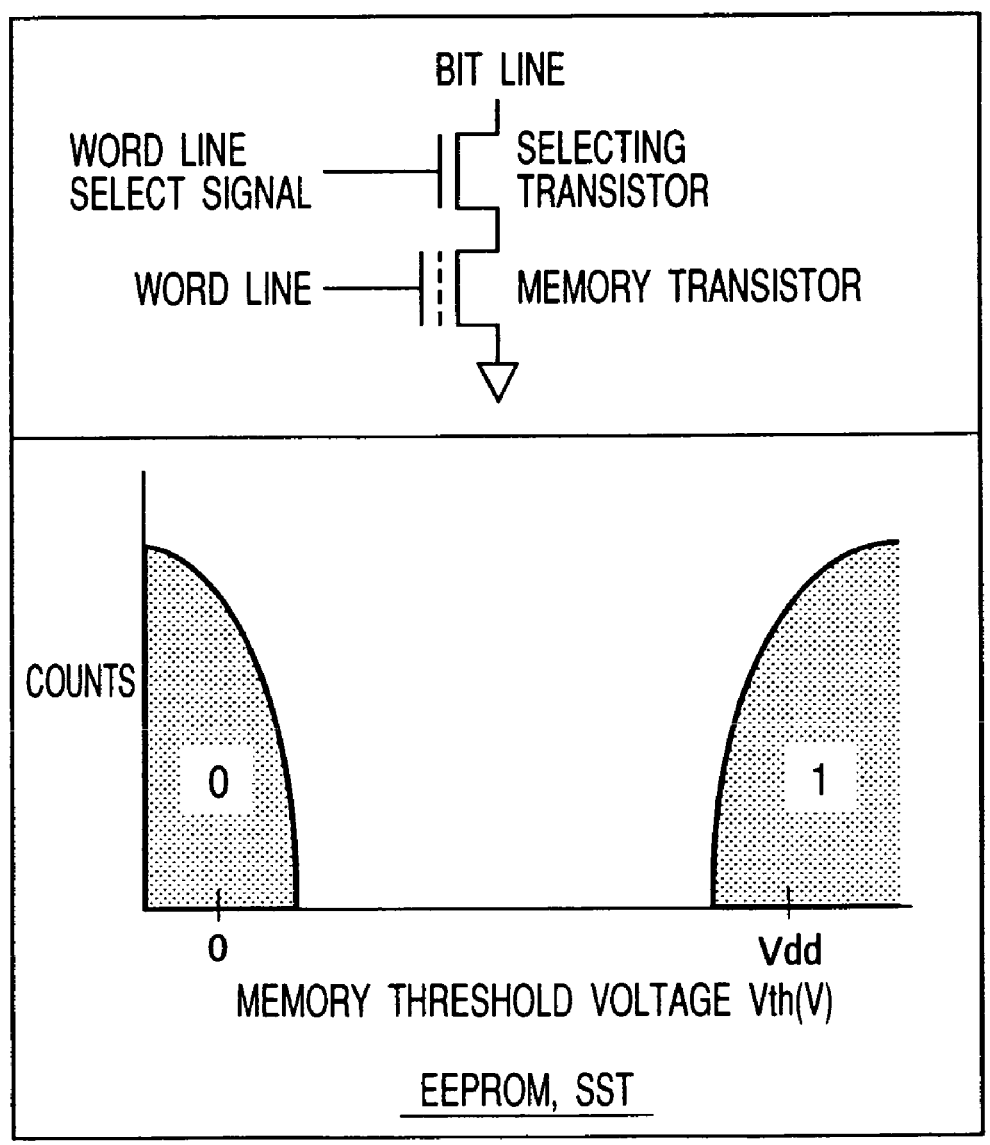
FIG. 40 is an explanatory diagram of a memory cell which is formed of a selecting transistor and a storage cell transistor connected in series.

The memory cell MC can have its information storing scheme selected from among storing of 2-value information, i.e., 1-bit information, with one transistor as illustrated in FIG. 38, and storing of 4-value information, i.e., 2-bit information, with one transistor as illustrated in FIG. 39. It can even store information of four values or more. In the case of storing 4-value information, it stores the information by selecting one of four threshold voltages as illustrated in FIG. 39. In the read-out operation, it changes the word line selection level in turn. Alternatively, by using an insulating charge trap film, such as a silicon nitride film, for the gate insulation film and by exchanging the positions of source and drain electrodes, 2-value data may be stored at each drain end, although this scheme is not shown in the figure. The memory cell MC may be formed of a selecting transistor an a storage cell transistor connected in series as illustrated in FIG. 40. In the case of using a selecting transistor, the write/erasure verification can be eliminated virtually without problems.

<Microcomputer>

Figure 41:
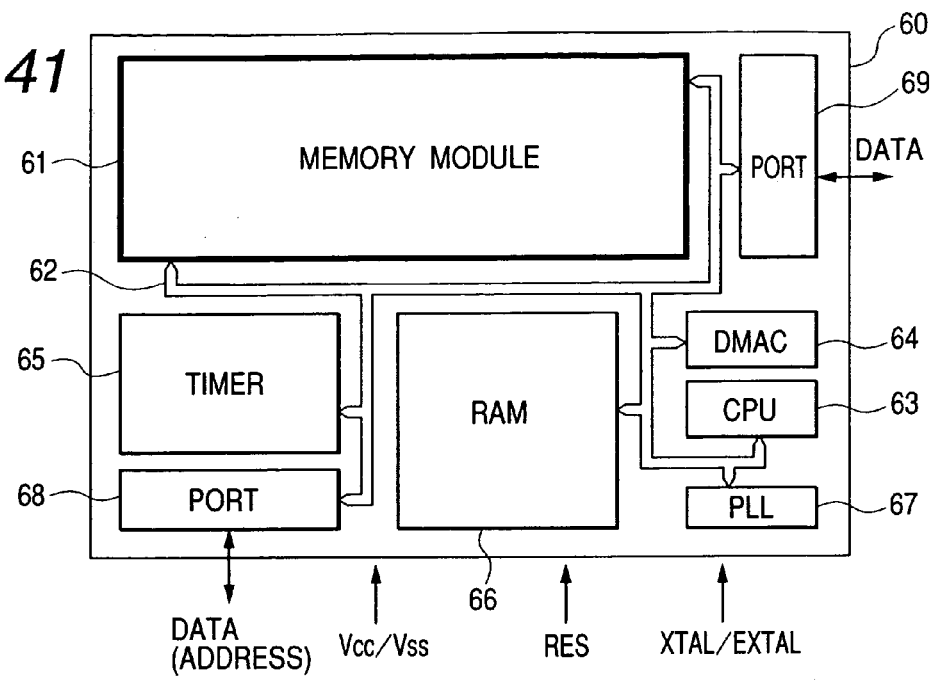
FIG. 41 is a block diagram illustrating, as another example of the semiconductor integrated circuit based on this invention, a microcomputer having on-chip provision of a non-volatile memory.

FIG. 41 illustrates, as another example of the semiconductor integrated circuit based on this invention, a microcomputer 60 having on-chip provision of the non-volatile memory described above. In the figure, a memory module 61 is configured to be the non-volatile memory explained in connection with FIG. 31 and FIG. 33. The memory module 61 undergoes access control by a CPU (central processing unit) 63 and DMAC (direct memory access controller) 64 through an internal bus 62. Further connected to the internal bus 62 are a timer 65, RAM 66, PLL 67, and ports 68 and 69. The microcomputer 60 performs the external interface through the ports 68 and 69. The memory module 61 is used for storing programs of CPU 63 and data. The CPU 63 fetches a reset vector of the program area in response to the negation of the reset signal RES, and fetches an instruction from the address indicated by the vector and executes the instruction. The microcomputer 60 operates in synchronism with a clock signal which is generated based on an oscillation element (not shown) connected to clock terminals XTAL and EXTAL.

<Memory Card>

Figure 42:
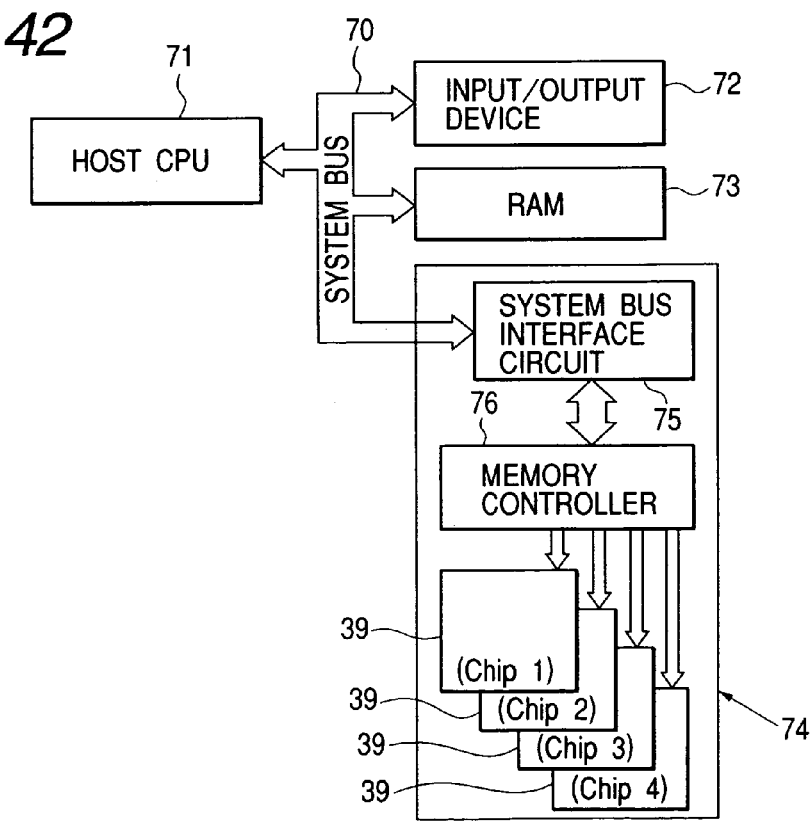
FIG. 42 is a block diagram illustrating a computer system which uses a flash memory.

FIG. 42 illustrates a computer system which uses the flash memory described above. The computer system includes a host CPU 71, input/output device 72, RAM 73, and memory card 74 which are interconnected through a system bus 70.

The memory card 74 includes a system bus interface circuit 75, memory controller 76, and multiple flash memories 39 which are built on a card substrate, although this feature is not compulsory.

The system bus interface circuit 75 is adapted to perform a standard bus interface such as the ATA (AT attachment) system bus, although this feature is not compulsory. The memory controller 76 connected to the system bus interface circuit 75 receives access commands and data from the host CPU 71 or a host system of the input/output device 72 which are connected to the system bus 70.

For example, in case the access command is the read-out command, the memory controller 76 makes access to certain one or more flash memories 39 and reads out and transfers data to the host CPU 71 or host system. In case the access command is the write command, the memory controller 76 makes access to certain one or more flash memories 39 and stores the write-in data from the host CPU 71 or host system into the memories. This storing operation includes the operation of writing to certain blocks, sectors and memory cells of flash memories and the operation of write verification. In case the access command is the erase command, the memory controller 76 makes access to certain one or more flash memories 39 and erases data in the memories. This erasing operation includes the operation of erasing of certain blocks, sectors and memory cells of flash memories 39 and the operation of erasure verification.

Data to be kept stored for a long time is stored in the flash memories 39, while data to be revised frequently during the process of the CPU 71 is stored in the RAM 73 which is a volatile memory.

The memory card 74 is intended as a utility compatible with a hard disk storage, although this feature is not compulsory, and it realizes a storage capacity of several tens gigabytes based on a number of flash memories 39.

The memory card 74 is not confined to a relatively thin memory card, but obviously it can be accomplished as a relatively thick non-volatile memory device which includes an interface with a host system and an intelligent controller capable of controlling non-volatile flash memories based on the analysis of commands of the host system.

While the present invention has been described in connection with the specific embodiments, the invention is not confined to these embodiments, but various alterations are obviously possible without departing from the essence of the invention.

Figure 43:
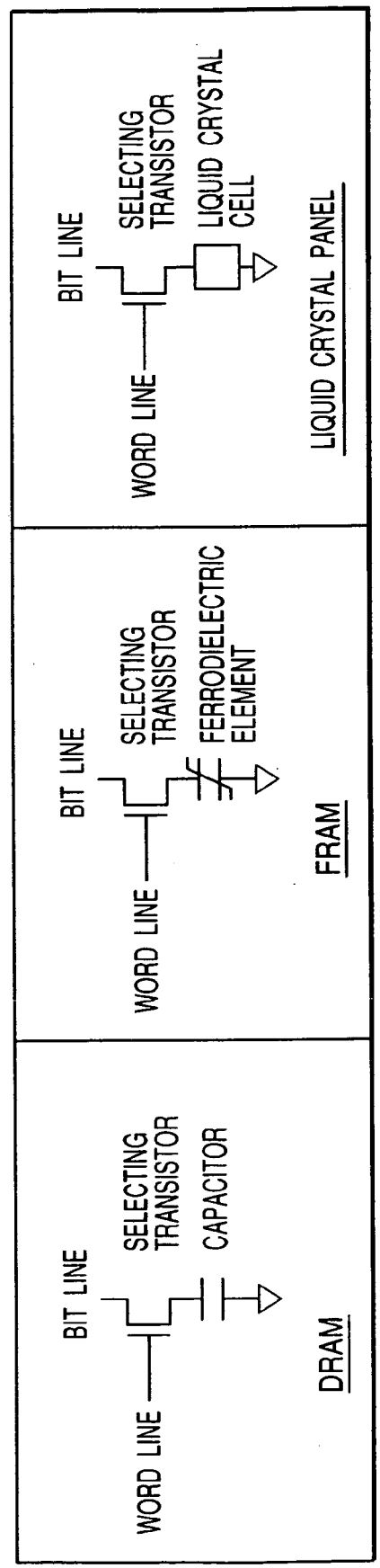
FIG. 43 is an explanatory diagram illustrating a DRAM cell, FRAM cell and liquid crystal display cell which are subjects of high voltage application by the high voltage output driver.

For example, although in the foregoing explanation, the subject of high voltage application by the high voltage output drivers is an electrically erasable and writable memory, the present invention is not confined to this case, but the high voltage output drivers and output switching circuits can be applied to the driving to the selection level of read-out word lines of memory cells of dynamic type each having a selecting transistor and a storage capacitor as illustrated in FIG. 43. Alternatively, the high voltage output drivers and output switching circuits can be applied to the supply of the high voltage writing word line level and bit line level of a ferrodielectric memory as an electrically rewritable non-volatile memory or to the supply of the bit line drive level for the signal electrodes of display cells of a dot-matrix liquid crystal display panel as illustrated in FIG. 43.

The high voltage generation circuit is not confined to the combination of charge pump circuits and a voltage dividing resistor circuit, but independent charge pump circuits may be used to generate individual high voltages. The step-up voltages may be produced based on cramping by means of cramp circuits or the like. The charge pump circuits may be configured to be a 4-phase clock synchronous circuit.

In this specification, MOS transistors are generically field effect transistors of insulated gate type.

Among the features of the present invention disclosed in this specification, the major effectiveness is briefed as follows.

The semiconductor integrated circuit based on this invention operates to reverse the complementary switching states of the first MOS transistor and second MOS transistor which constitute a high voltage output driver such that one transistor in the on-state is switched to the off-state first and another transistor is switched to the on-state afterward. Namely, it turns off the on-state transistor (transistor of Vds=0 V) first, and thereafter turns on the MOS transistor having high voltage application for Vds. Consequently even if the Vds of a MOS transistor exceeds the minimum breakdown voltage (BVds_min) when it operates to turn on, the through current path is already cut off, and therefore the high voltage output driver does not break down. In consequence, it is possible to reverse the output of high voltage output driver in the presence of application of the power voltage above the minimum breakdown voltage (BVds_min).

In case the circuital cells are specifically electrically erasable and writable non-volatile memory cells, it is not necessary for these memory cells at the time of writing or erasure to step down the operational power voltages of the high voltage output drivers down to the minimum breakdown voltage (BVds_min) at the switching of word lines of high voltage driving or switching of source lines of high voltage driving, and it is not necessary to repeat the voltage step-up and discharging of the voltage step-up nodes of the voltage step-up circuits which produce the high voltages for writing, whereby the waste of power can be prevented and the speed-up of write operation can be accomplished.

The first switching signal which is input to the gate of the first MOS transistor is a signal which changes in a range of a first voltage difference downwardly from the source voltage of the first MOS transistor, with the first voltage difference being smaller than the minimum drain-source breakdown voltage of the p-channel MOS transistor of the output switching circuit. Similarly, the second switching signal which is input to the gate of the second MOS transistor is a signal which changes in a range of a second voltage difference upwardly from the source voltage of the second MOS transistor, with the second voltage difference being smaller than the minimum drain-source breakdown voltage of the n-channel MOS transistor of the output switching circuit. In consequence, in the output switching circuit either, the MOS transistor does not break down between the drain and source.

Applying the present invention to semiconductor non-volatile memories, memory cards, and microcomputers enables the reduction of write operation cycle time of non-volatile memory cells such as flash memory cells, and avoids the useless power consumption caused by breakdown.

INDUSTRIAL APPLICABILITY

The present invention can be applied extensively to flash memories and ferrodielectric memories which use high voltages for the writing, etc. of information to be stored, to DRAMs and SDRAMs which use word line step-up voltages, and to microcomputers which have on-chip provision of these memories.

The invention claimed is:
1. A semiconductor integrated circuit comprising:
a memory cell array including a matrix arrangement of a plurality of memory cells which are adapted to operate selectively in certain manners by application of high voltages thereto;
a plurality of signal lines for supplying said high voltages to said memory cells;
high voltage output drivers which are provided for said signal lines individually;
output switching circuits for said high voltage output drivers; and
a high voltage generation circuit which supplies high-voltage operational power to said high voltage output drivers,
wherein each said high voltage output driver includes a series circuit having a first MOS transistor and a second

MOS transistor in current paths of said high voltages, with a serial connection node thereof being driver output terminal, wherein said first MOS transistor has drain-source voltage applied thereto in excess of a breakdown voltage during a voltage transition of a corresponding signal line from a high-voltage level to a low-voltage level, wherein said second MOS transistor has a drain-source voltage applied thereto in excess of a breakdown voltage during a voltage transition of the corresponding signal line from a low-voltage level to a high-voltage level, and wherein each said output switching circuit is coupled with a first control signal and a second control signal and operates in response to a switching command signal to switch states of said first and second MOS transistors of a corresponding high voltage output driver, such that one of said transistors in an on-state is switched to an off-state by outputting said first control signal to a gate terminal of said one transistor via a first control signal line and the other of said transistors is thereafter switched to an on-state by outputting said second control signal to a gate terminal of said other transistor via a second control signal line.

2. A semiconductor integrated circuit according to claim 1, wherein said memory cells are non-volatile memory cells, each of which is electrically erasable and electrically writable, said plurality of signal lines include a plurality of word lines, and a respective output switching circuit is coupled to one of said plurality of word lines and is supplied with a word line selection signal as said switching command signal therefor.

3. A semiconductor integrated circuit according to claim 2, further including a respective third MOS transistor which is adapted to supply a verify voltage to a corresponding word line, which is coupled to a corresponding serial connection node, wherein said respective output switching circuit outputs said first control signal and said second control signal in response to an instruction of a verification operation to switch off said first and second MOS transistors thereof, and operates on the corresponding third MOS transistor to supply said verify voltage to said corresponding word line.

4. A semiconductor integrated circuit according to claim 2, wherein said signal lines include bit lines, a respective output switching circuit is coupled to each said bit line, and is supplied with data to be written as said switching command signal therefor.

5. A semiconductor integrated circuit according to claim 4, wherein said signal lines include source lines, a respective output switching circuit is coupled to each source line, and is supplied with a source line selection signal as said switching command signal therefor.

6. A semiconductor integrated circuit according to claim 4, wherein said signal lines include substrate voltage supply lines for supplying substrate voltages to semiconductor regions where channels of said non-volatile memory cells are formed, a respective output switching circuit is connected to each substrate voltage supply line and is supplied with a substrate voltage selection signal as said switching command signal therefor.

7. A semiconductor integrated circuit according to claim 5, further including a CPU which receives information read out from said non-volatile memory cells or stores information to be written to said non-volatile memory cells.

8. A semiconductor integrated circuit according to claim 1, wherein said memory cells are dynamic memory cells, said signal lines include a word line, and a respective output switching circuit is coupled to the word line, and the word line is supplied with a word line selection signal for switching states of said first and second MOS transistors of the respective output switching circuit.

9. A semiconductor integrated circuit according to claim 1, wherein said first MOS transistor is a p-channel type MOS transistor and said second MOS transistor is an n-channel type MOS transistor.

10. A semiconductor integrated circuit according to claim 9, wherein said output switching circuit includes: a sequencer section which receives said switching command signal and outputs a first timing signal and a second timing signal; a first voltage converting section which receives said first timing signal and outputs a first switching signal for said first MOS transistor; and a second voltage converting section which receives said second timing signal and outputs a second switching signal for said second MOS transistor, wherein said first switching signal varies within a range of a first voltage difference downwardly from the source voltage of said first MOS transistor, with said first voltage difference being smaller than a minimum drain-source breakdown voltage of said p-channel MOS transistor of said output switching circuit, and wherein said second switching signal varies within a range of a second voltage difference measured upwardly from the source voltage of said second voltage transistor, with said second voltage difference being smaller than a minimum drain-source breakdown voltage of said n-channel MOS transistor of said output switching circuit.

11. A semiconductor integrated circuit according to claim 10, wherein said first and second timing signals are adapted to change between the ground voltage of said sequencer section and a first power voltage, and wherein said first and second voltage differences are based on a voltage difference of said first power voltage and said ground voltage of said sequencer section.

12. A semiconductor integrated circuit according to claim 11, wherein said first voltage converting section includes:

a first static latch circuit which includes two antiparallel-connected inverter circuits which derive operational power from said source voltage of said first MOS transistor and a voltage which is lower than said source voltage of said first MOS transistor by an amount of said first power voltage;

a first coupling capacitor having a capacitive electrode coupled with a first input/output node of said first static latch circuit; and a second coupling capacitor having a capacitive electrode thereof coupled with a second input/output node of said first static latch circuit, wherein said first and second coupling capacitors have other capacitive electrodes supplied with complementary signals which are produced based on said first timing signal, and an output of said first static latch circuit is said first switching signal, and wherein said second voltage converting section includes:

a second static latch circuit which includes two antiparallel-connected inverter circuits which derive operational power from said source voltage of said second MOS transistor and a voltage which is higher than said source voltage of said second MOS transistor by an amount of said first power voltage;

a third coupling capacitor having a capacitive electrode thereof coupled with a first input/output node of said second static latch circuit; and a fourth coupling capacitor having a capacitive electrode thereof coupled with a second input/output node of said second static latch circuit, wherein said third and fourth coupling capacitors have other capacitive electrodes supplied with complementary signals which are produced based on said second timing signal, and an output of said second static latch circuit is said second switching signal.

13. A semiconductor integrated circuit according to claim 3, wherein said signal lines include a bit line, a respective output switching circuit is coupled to said bit line and is supplied with data to be written as said switching command signal therefor.

14. A semiconductor integrated circuit according to claim 13, wherein said signal lines include a source line, respective output switching circuit is coupled to said source line and is supplied with a source line selection signal as said switching command signal therefor.

15. A semiconductor integrated circuit according to claim 14, wherein said signal lines include a substrate voltage supply line for supplying a substrate voltage to a semiconductor region where a channel of a non-volatile memory cell is formed, a respective output switching circuit is connected to said substrate voltage supply line and is supplied with a substrate voltage selection signal as said switching command signal therefor.

16. A semiconductor integrated circuit according to claim 15, further including a CPU which receives information read out from said non-volatile memory cells or stores information to be written to said non-volatile memory cells.

17. A semiconductor integrated circuit according to claim 6, further including a CPU which receives information read out from said non-volatile memory cells or stores information to be written to said non-volatile memory cells.

18. A microcomputer structured on a semiconductor chip comprising:

a non-volatile memory including a memory cell array having a matrix arrangement of a plurality of non-volatile memory cells which are adapted to operate selectively for erasing and writing by application of high voltages thereto, a plurality of signal lines for feeding said high voltages to said non-volatile memory cells, high voltage output drivers which are provided for said signal lines individually, output switching circuits for said high voltage output drivers, and a high voltage generation circuit which supplies high-voltage operational power to said high voltage output drivers;

a CPU which is adapted to access said non-volatile memory; and a bus which connects between said non-volatile memory and said CPU, wherein each said high voltage output driver includes a series circuit having a first MOS transistor and a second MOS transistor in current paths of said high voltages, with a serial connection node thereof being a driver output terminal, wherein said first MOS transistor has drain-source voltage applied thereto in excess of a breakdown voltage during a voltage transition of a corresponding signal line from a high-voltage level to a low-voltage level, wherein said second MOS transistor has a drain-source voltage applied thereto in excess of a breakdown voltage during a transition of the corresponding signal line from a low-voltage level to a high-level voltage level, and wherein each said output switching circuit is coupled with a first control signal and a second control signal and operates in response to a switching command signal to switch states of said first and second MOS transistors of the corresponding high voltage output driver, such that one of said transistors in an on-state is switched to an off-state by outputting said first control signal to a gate terminal of said one transistor via a control signal line and the other one of said transistors is thereafter switched to said on-state by outputting said second control signal to a gate terminal of said other transistor via a second control signal line.

19. A semiconductor integrated circuit comprising:

a signal line;

a high voltage generation circuit;

a high voltage output driver provided for said signal line and which derives operational power from high voltages supplied from said high voltage generation circuit; and a switching circuit, wherein said high voltage output driver includes a series circuit having a first MOS transistor and a second MOS transistor in current paths of said high voltages, with a serial connection node thereof being the driver output terminal, wherein said first MOS transistor has drain-source voltage applied thereto in excess of a breakdown voltage during a transition of said signal line from a high-voltage level to a low-voltage level, wherein said second MOS transistor has a drain-source voltage applied thereto in excess of a breakdown voltage during a transition of said signal line from a low-voltage level to a high-voltage level, and wherein said switching circuit is coupled with a first control signal and a second control signal to switch states of said first and second MOS transistors, such that one of said transistors in an on-state is switched to an off-state by outputting said first control signal to a gate terminal of said one transistor and the other one of said transistors is thereafter switched to an on-state by outputting said second control signal to a gate terminal of said other transistor.

* * * * *